United States Patent
Owada

(10) Patent No.: US 8,883,613 B2
(45) Date of Patent: Nov. 11, 2014

(54) MANUFACTURING METHOD OF SEMICONDUCTOR DEVICE, PROCESSING METHOD OF SEMICONDUCTOR WAFER, SEMICONDUCTOR WAFER

(71) Applicant: Fujitsu Semiconductor Limited, Yokohama (JP)

(72) Inventor: Tamotsu Owada, Yokohama (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 13/650,465

(22) Filed: Oct. 12, 2012

(65) Prior Publication Data

US 2013/0161795 A1 Jun. 27, 2013

(30) Foreign Application Priority Data

Dec. 21, 2011 (JP) ................................. 2011-280569

(51) Int. Cl.
H01L 21/46 (2006.01)

(52) U.S. Cl.
USPC ............................ 438/459; 438/455; 438/458

(58) Field of Classification Search
USPC .......................................... 438/455, 458, 459
See application file for complete search history.

(56) References Cited

U.S. PATENT DOCUMENTS

| 8,088,670 B2 * | 1/2012 | Akiyama et al. ............... 438/458 |
| 8,158,489 B2 | 4/2012 | Huang et al. |
| 2005/0023647 A1 * | 2/2005 | Nemoto et al. ................ 257/620 |

FOREIGN PATENT DOCUMENTS

| JP | 2011-009750 A | 1/2011 |
| JP | 2011-023659 A | 2/2011 |

* cited by examiner

Primary Examiner — Bradley K Smith
(74) Attorney, Agent, or Firm — Westerman, Hattori, Daniels & Adrian, LLP

(57) ABSTRACT

A disclosed method of manufacturing a semiconductor device includes forming a groove on a first surface of a semiconductor wafer along an outer periphery of the semiconductor wafer, forming a semiconductor device on the first surface, forming an adhesive layer on the first surface to cover the semiconductor device, bonding a support substrate to the first surface by the adhesive layer, grinding after the adhering of the support substrate a second surface of the semiconductor wafer opposite to the first surface, and dicing after the grinding the semiconductor wafer into individual semiconductor chips.

11 Claims, 33 Drawing Sheets

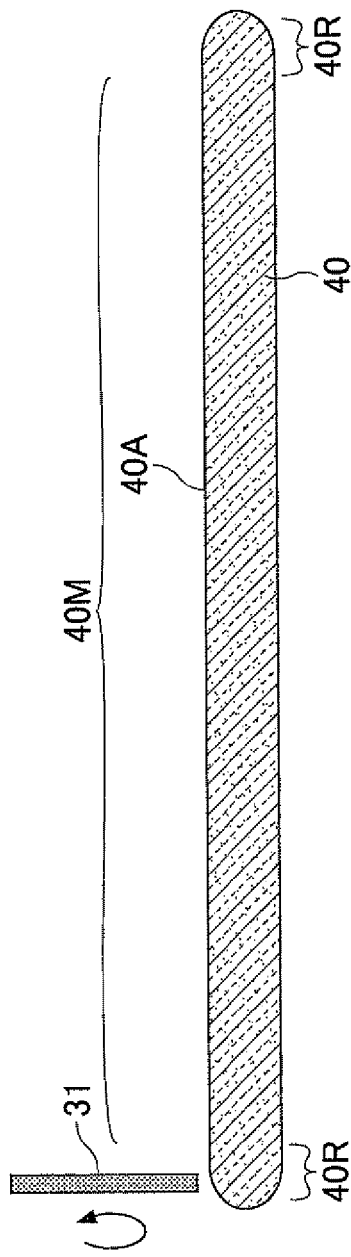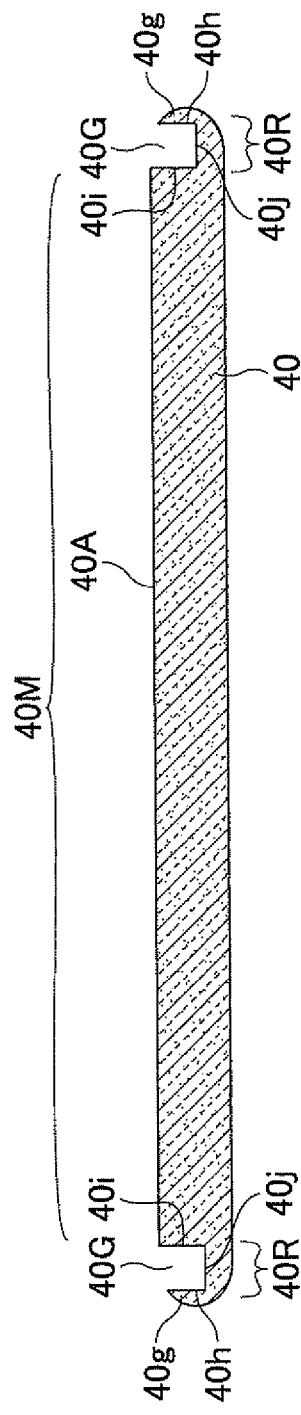

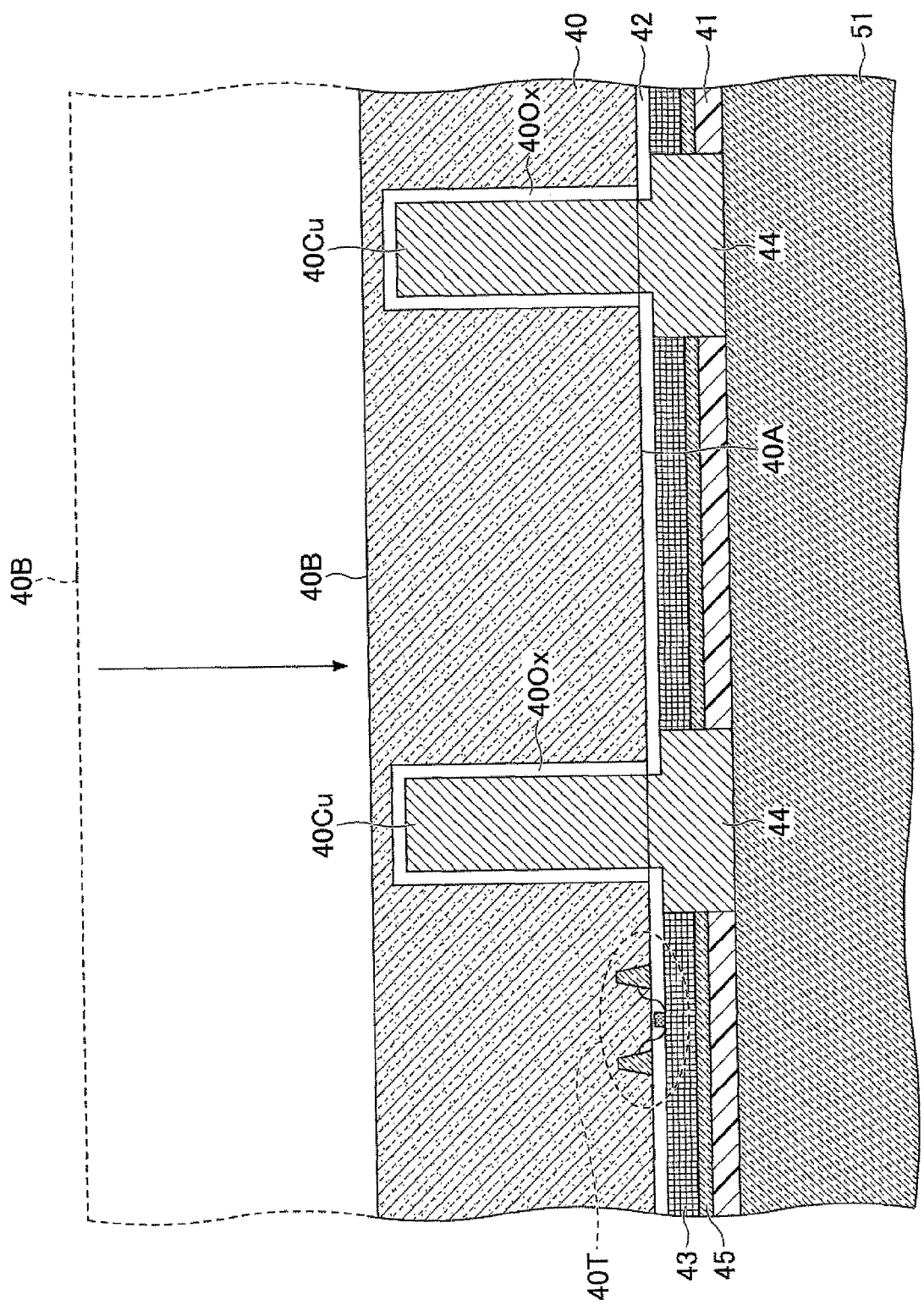

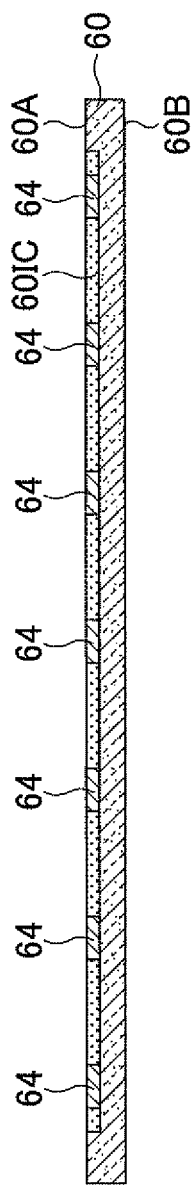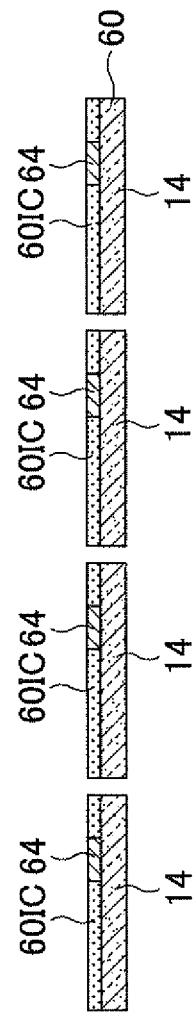

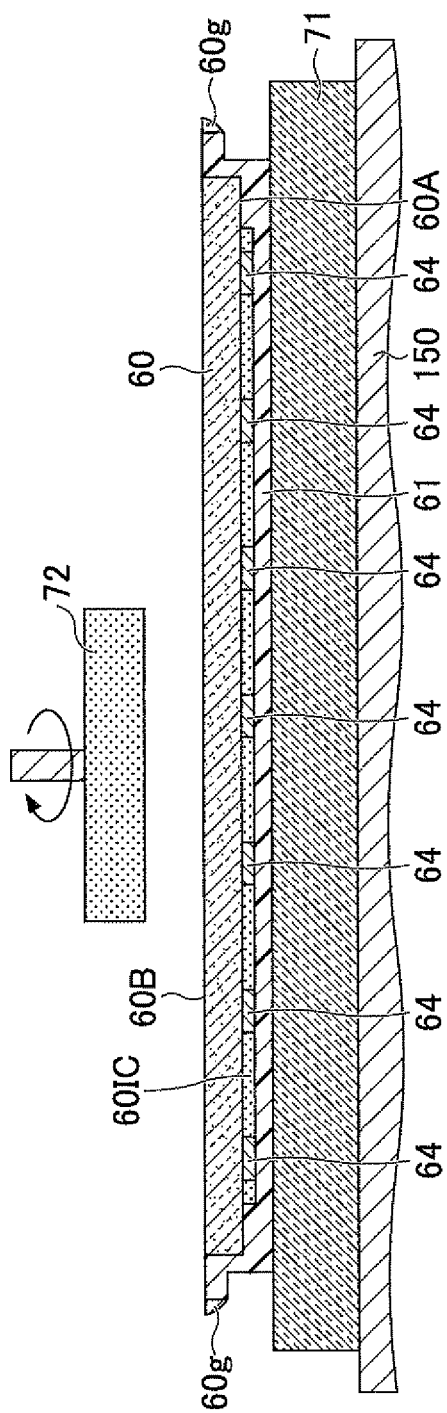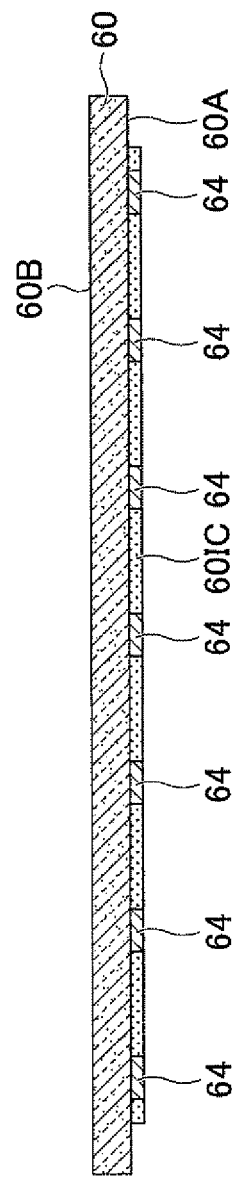
FIG.11A
FIG.11B

MANUFACTURING METHOD OF SEMICONDUCTOR DEVICE, PROCESSING METHOD OF SEMICONDUCTOR WAFER, SEMICONDUCTOR WAFER

CROSS-REFERENCE TO RELATED APPLICATIONS

This application is based upon and claims the benefit of priority of the prior Japanese Patent Application 2011-280569, filed on Dec. 21, 2011, the entire contents of which are hereby incorporated herein by reference.

FIELD

The embodiments described herein relate to semiconductor devices and manufacturing method thereof.

BACKGROUND

With advancement of miniature processing technologies, it is now realized semiconductor integrated circuits of very large integration density.

With the prospect of increasing the integration density further, investigations are being made for three-dimensional semiconductor integrated circuit devices in which a large number of two-dimensional semiconductor integrated circuit devices are stacked one after another.

PRIOR ART REFERENCES

Patent References

[Patent Reference 1] Japanese Laid-Open Patent Application 2011-9750
[Patent Reference 2] Japanese Laid-Open Patent Application 2011-23659

SUMMARY

In an aspect, a manufacturing method of a semiconductor device includes forming a groove to a first surface of a semiconductor wafer so as to extend along an outer periphery of the semiconductor wafer, forming a semiconductor device on the first surface, forming an adhesive layer on the first surface to cover the semiconductor device, bonding a support substrate to the first surface by the adhesive layer, grinding after bonding the support substrate a second surface of the semiconductor wafer opposite to the first surface, and dicing after the grinding the semiconductor wafer into individual semiconductor chips.

Additional objects and advantages of the embodiment will be set forth in part in the description which follows, and in part will be obvious from the description, or may be learned by practice of the disclosures. The object and advantages of the disclosures will be realized and attained by means of the elements and combinations particularly pointed out in the appended claims.

It is to be understood that both the foregoing general description and the following detailed description are exemplary and explanatory only and are not restrictive of the disclosures, as claimed.

BRIEF DESCRIPTION OF DRAWINGS

FIGS. 3A-3I are cross-sectional diagrams representing a process of manufacturing a semiconductor chip of FIG. 2;

FIGS. 9A-9F are cross-sectional diagrams explaining a process of manufacturing a semiconductor chip according to a second embodiment;

FIGS. 11A-11E are cross-sectional diagrams explaining a process of manufacturing a semiconductor chip according to a third embodiment.

DESCRIPTION OF EMBODIMENT

Embodiments that describe the best mode for carrying out the present disclosures are explained next with reference to the drawings.

In order to realize a three-dimensional semiconductor integrated circuit device, it is desired that a two-dimensional semiconductor integrated circuit device constituting the three-dimensional semiconductor integrated circuit device is connected electrically to an adjacent two-dimensional semiconductor integrated circuit device with a shortest path. Thus, there is a demand for the technology capable of reducing the thickness of the semiconductor substrate in each of the two-dimensional semiconductor integrated circuit devices and further to form through via-plugs (TSV) in each of the semiconductor substrates.

[First Embodiment]

Figure 1:
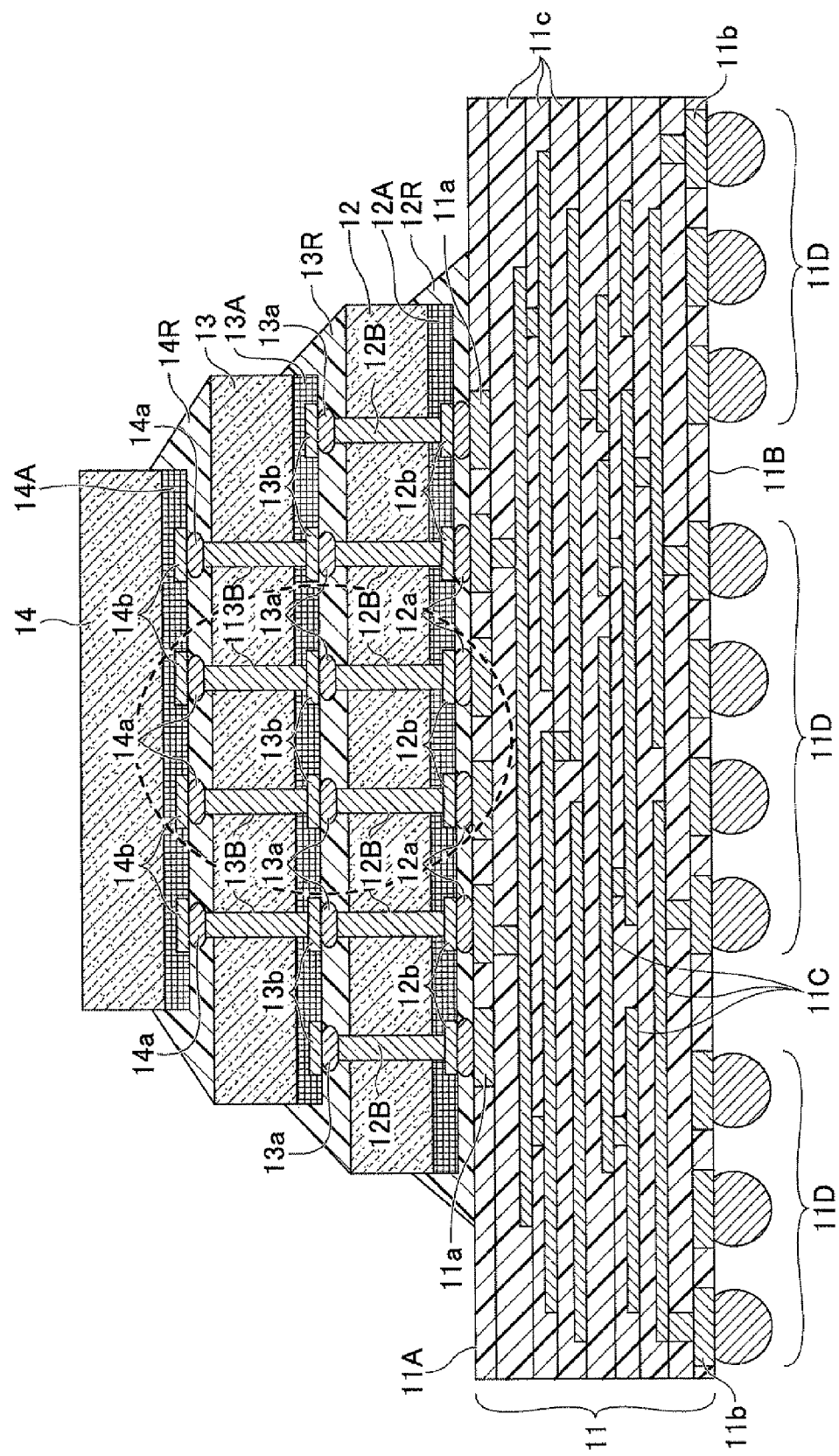
FIG. 1 is a cross-sectional diagram representing the construction of a three-dimensional semiconductor integrated circuit device according to a first embodiment.

FIG. 1 is a cross-sectional diagram representing an example of a semiconductor integrated circuit device 10 according to a first embodiment and having a three-dimensional mounting structure.

Referring to FIG. 1, the semiconductor integrated circuit device 10 includes a package substrate 11 having connection pads 11a on a top principal surface 11A and connection pads 11b on a bottom principal surface 11B, the package substrate 11 including therein alternate stacking of buildup insulator films 11c and wiring patterns 11C, a first semiconductor chip 12 flip-chip mounted upon the package substrate 11, a second semiconductor chip 13 further flip-chip mounted upon the first semiconductor chip 12, and a third semiconductor chip 14 flip-chip mounted upon the second semiconductor chip 13, wherein there are formed through via-plugs 12B of copper, for example, in the semiconductor chip in row and column formation. Likewise, through via-plugs 13B are formed in the semiconductor chip in row and column formation.

The semiconductor chip 12 is formed with a semiconductor device such as a MOS transistor and a multilayer interconnection structure 12A on a bottom principal surface thereof, wherein each of the through via-plugs 12B extends from the top principal surface to the bottom principal surface of the semiconductor chip 12 and is connected to the connection pad 12b formed in the multilayer interconnection structure 12A at the bottom principal surface. The connection pad 12b is electrically connected to a corresponding connection pad 11a on the corresponding package substrate 11 via a solder bump 12a. As a result, the semiconductor chip 12 is also connected to the package substrate 11 mechanically and firmly.

Likewise, the semiconductor chip 13 is formed with a semiconductor device such as a MOS transistor and a multilayer interconnection structure 13A on a bottom principal surface thereof, wherein each of the through via-plugs 13B extends from the top principal surface to the bottom principal surface of the semiconductor chip 13 and is connected to the connection pad 13b forming a part of the multilayer interconnection structure 13A at the foregoing bottom principal surface. Further, the connection pad 13b is connected electrically to a corresponding through via-plug 12B of the semiconductor chip 12 via a solder bump 13a. As a result, the semiconductor chip 13 is also connected to the underlying semiconductor chip 12 mechanically and firmly.

Further, the semiconductor chip 14 is formed with a multilayer interconnection structure 14A having electrode pads 14b at the bottom principal surface thereof, wherein the semiconductor chip 14 is connected electrically and mechanically to the semiconductor chip 13 by connecting the electrode pad 14b to a corresponding through via-plug 13B of the underlying semiconductor chip 13 via a solder bump 14a.

Further, the space between the package substrate 11 and the semiconductor chip 12 is sealed with a seal resin 12R, and the space between the semiconductor chip 12 and the semiconductor chip 13 is sealed likewise by a seal resin 13R. Further, the space between the semiconductor chip 13 and the semiconductor chip 14 is sealed with a seal resin 14R.

Further, there are formed solder bumps 11D on the bottom surface 11B of the package substrate 11 respectively in correspondence to the electrode pads 11b.

Figure 2:
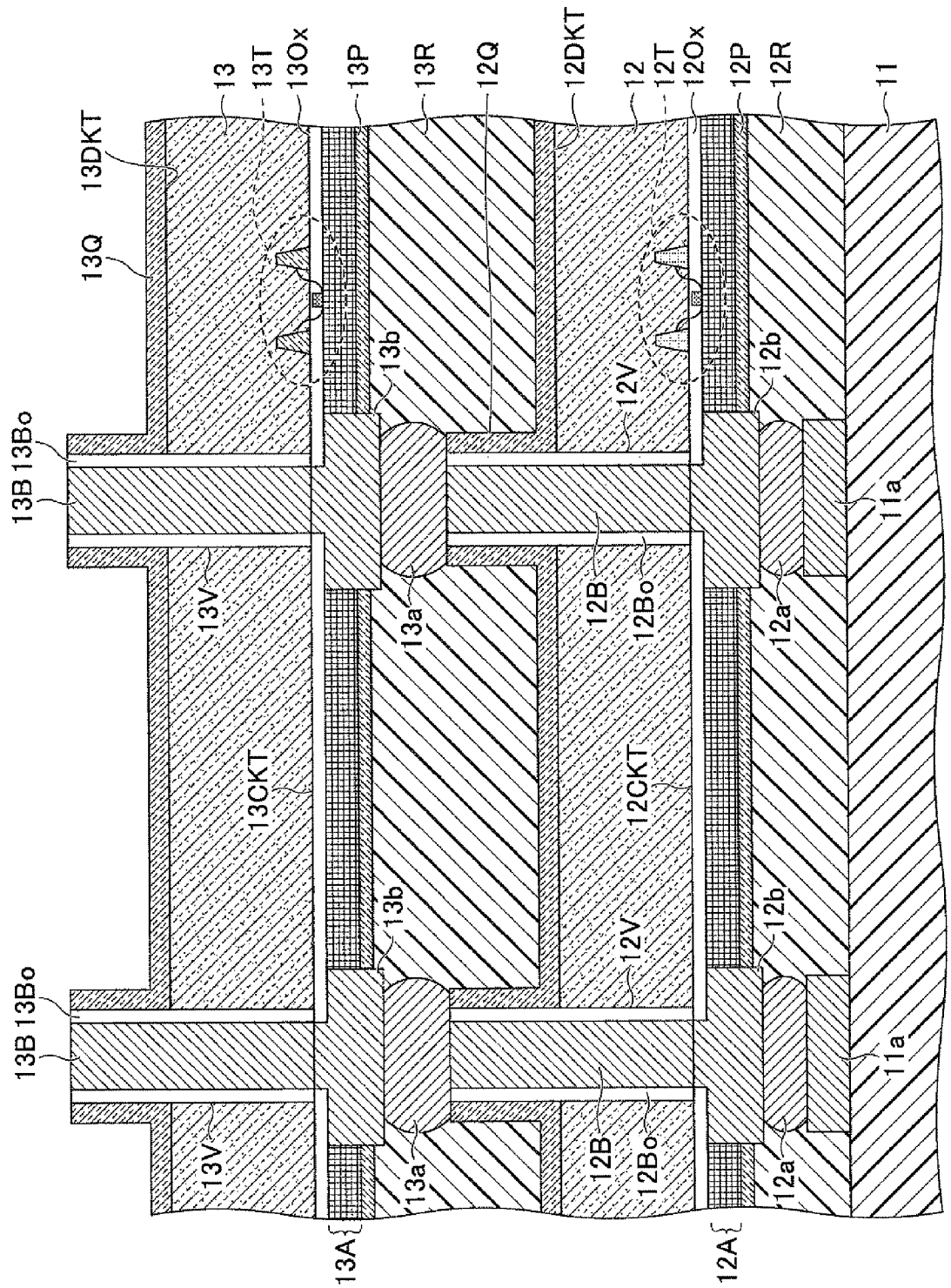
FIG. 2 is an enlarged cross-sectional diagram representing a part of the three-dimensional semiconductor integrated circuit device of FIG. 1.

FIG. 2 is a cross-sectional diagram representing a part of the semiconductor integrated circuit device 10 of FIG. 1 surrounded with a broken line.

Referring to FIG. 2, both of the semiconductor chips 12 and 13 are formed of a silicon substrate of a thickness of 20 μm to 300 μm, such as 100 μm, wherein the semiconductor chip 12 is formed with a semiconductor device 12T such as a MOS transistor on a circuit formation surface 12CKT, which is represented as a bottom surface in the illustrated state. Likewise, the semiconductor chip is formed with a semiconductor device 13T such as a MOS transistor on a circuit formation surface 13C, which is represented as a bottom surface in the illustrated state.

On the circuit formation surface 12CKT, the semiconductor chip 12T is covered with an insulation film 12Ox, and there is formed a multilayer interconnection structure 12A on the insulation film 12Ox such that a large number of wiring layers are stacked with intervening interlayer insulation films. Detailed explanation of the multilayer interconnection structure 12A will be omitted. Likewise, the semiconductor chip 13T is covered with an insulation film 13Ox on the circuit formation surface 13CKT, and there is formed a multilayer interconnection structure 13A on the insulation film 13Ox such that a large number of wiring layers are stacked with intervening interlayer insulation films. Detailed explanation of the multilayer interconnection structure 13A will be omitted.

In the silicon substrate that constitutes the semiconductor chip 12, there are formed through-via holes 12V each extending from the circuit formation surface 12CKT to an opposing surface 12DKT, wherein the through via-plugs 12B are formed in the through via-holes 12V to extend beyond the opposing surface 12DKT. Further, in correspondence to the bottom edge of the through via-plugs 12B, there are formed connection pads 12b in the interlayer insulation structure 12A. The through via-holes 12V have respective sidewall surfaces formed with an insulation film 12Bo of a thermal oxide film, or the like, wherein the through via-plugs 12B are formed in the through via-holes 12V in the state insulated from the silicon constituting the semiconductor chip 12 by the insulation film 12Bo.

The connection pads 12b are electrically connected and mechanically bonded to the corresponding connection pads 11a on the package substrate 11 via solder bumps 12a. In the illustrated example, there is formed a protective film 12P of a silicon nitride film or polyimide film and having an opening corresponding to the solder bumps 12b on the multilayer interconnection structure 12A.

Similarly, in the silicon substrate that constitutes the semiconductor chip 13, there are formed through-via holes 13V each extending from the circuit formation surface 13CKT to an opposing surface 13DKT, wherein the through via-plugs 13B are formed in the through via-holes 13V to extend beyond the opposing surface 13DKT.

Further, in correspondence to the bottom edge of the through via-plugs 13B, there are formed connection pads 13b in the interlayer insulation structure 13A. The through via-holes 13V have respective sidewall surfaces formed with an insulation film 13Bo of a thermal oxide film, or the like, wherein the through via-plugs 13B are formed in the through via-holes 13V in the state insulated from the silicon constituting the semiconductor chip 13 by the insulation film 13Bo.

The connection pads 13b are electrically connected and mechanically bonded to the corresponding through via-plugs 12B on the semiconductor chip 12 via solder bumps 13a. In the illustrated example, there is formed a protective film 13P of a silicon nitride or polyimide and having an opening corresponding to the solder bumps 13a on the multilayer interconnection structure 13A.

Further, on the opposing surface 12DKT of the semiconductor chip 12, there is formed a protective film 12Q of silicon nitride film, or the like, so as to protect the protruding through via-plugs 12B. Likewise, on the opposing surface 13DKT of the semiconductor chip 13, there is formed a protective film 13Q of silicon nitride film, or the like, so as to protect the protruding through via-plugs 13B.

In such a three-dimensional semiconductor integrated circuit device, it is preferable to reduce the thickness of the semiconductor chips 12 and 13 as much as possible and reduce the length of the through via-plugs 12B or 13B as much as possible such that the overall size of the device is reduced and the delay of the signals transmitted from one semiconductor chip to another semiconductor chip is minimized. For example, in such a three-dimensional semiconductor integrated circuit device, it is preferable to set the thickness of the semiconductor chips 12 and 13 to 100 μm or less, such as 50 μm or less. In order to attain this, it is necessary to reduce the thickness of the semiconductor wafer from which the semiconductor chips 12 or 13 are diced out.

Hereinafter, the technology used with the present embodiment for reducing the semiconductor wafer will be explained with reference to FIGS. 3A-3H.

Referring to FIG. 3A, the semiconductor wafer 40 corresponds to a silicon substrate constituting the semiconductor chip 12 or 13 and includes a main part 40M having a flat top principal surface 40A corresponding to the circuit formation surface 12CKT or 13CKT and an outer peripheral part 40R that includes a rounded edge formed outside the main part 40M. In the step of FIG. 3A, there is applied a grinding wheel 31 rotating as indicated by an arrow at the foregoing outer peripheral part 40R, and there is formed a groove 40G having a predetermined depth and width are formed in a ring shape to surround the top principal surface 40A as represented in FIG. 3B. For such a grinding wheel 31, it is possible to use a grinding wheel marketed by DISCO Corporation under the trade name of P1A series. The desired groove 40G may be formed by rotating the silicon wafer 40 and the grinding wheel 31 and urging the grinding wheel 31 against the silicon wafer 40.

Referring to FIG. 3B, the outer peripheral part 40R includes an outer wall part 40g formed unitary to the silicon wafer 40 and constituting the outermost peripheral part of the silicon wafer 40, and there is formed a groove 40G between the main part 40M and the outer wall part 40g such that the groove 40G is defined by an inner wall surface 40h of the outer wall part 40g, an outer wall surface 40i of the wafer main part 40M opposing to the inner wall surface 40h, and a bottom surface 40j connecting the inner wall surface 40h and the outer wall surface 40i.

As will be explained later in detail, the groove 40G is formed to have a depth, more exactly a height of the sidewall surface 40i as measured from the bottom surface 40j, corresponding to the thickness of the silicon substrate constituting the semiconductor chip 12 or 13. Further, the height of the outer wall part 40g, and thus the height of the sidewall surface 40h, is set lower than the height of the sidewall surface 40i.

Figure 3C:
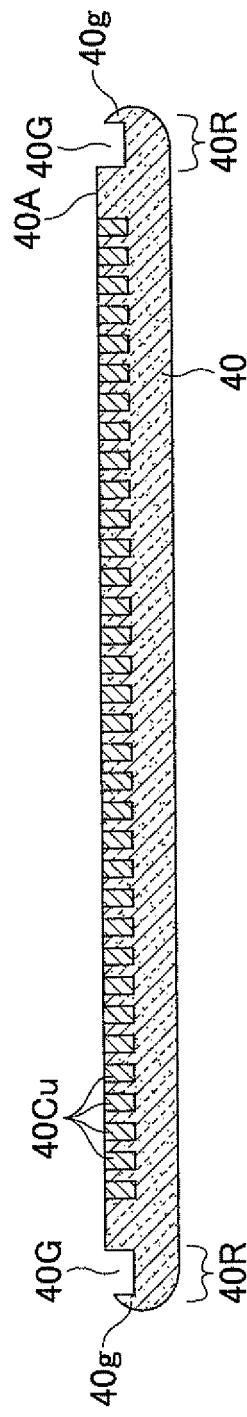

Further, as represented in FIG. 3C, there are formed a large number of via-holes (not shown) to the top principal surface 40A of the silicon wafer 40 of the state of FIG. 3B in correspondence to the large number of semiconductor devices formed on the main part 40M, such that the via-holes have a depth exceeding the thickness of the semiconductor substrate that constitutes the semiconductor chip 12 or 13 for the foregoing via-holes 12V or 13V. By filling the via-holes thus formed by electrolytic plating of copper, or the like, there are formed a large number of via-plugs 40Cu in correspondence to the via-plugs 12B or 13B. Further, with the process of FIG. 3C, there are formed, although the illustration thereof are omitted, the semiconductor devices 12T or 13T of FIG. 2 as well as the multilayer interconnection structure 12A or 13A. Here, it should be noted that the via-plug 40Cu is not limited to the via-plug of copper. For example, in the case other metal such as gold (Au) is plated, there are formed gold via-plugs as the via-plugs 40Cu.

In the illustrated example, the via-plugs 40Cu are formed to have a depth corresponding to the depth of the groove 40G. However, the present embodiment is not limited to such a specific construction and the tip end of the via-plug 40Cu may be formed shallower or deeper than the bottom 40j of the groove 40G.

Further, while the present embodiment forms the semiconductor devices 12T or 13T and the multilayer interconnection structures 12A or 13A after formation of the via-plugs 40Cu, it should be noted that the semiconductor devices 12T or 13T and the multilayer interconnection structures 12A or 13A may be formed first and the via-plugs 40Cu are formed thereafter.

Figure 3D:
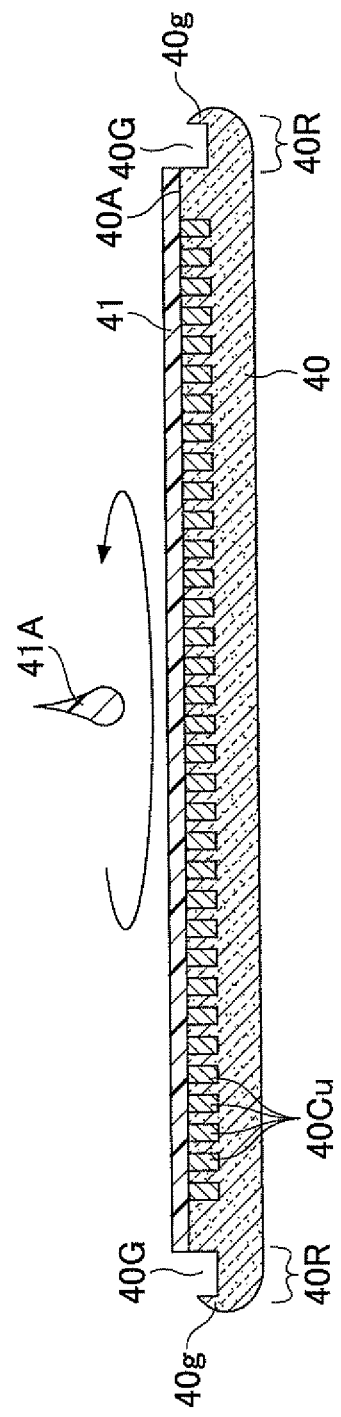

Further, as represented in FIG. 3D, the silicon wafer 40 is spun with high speed of 500 rpm-5000 rpm, such as the speed of 3000 rpm, and a temporary adhesive layer 41 is formed on the top principal surface 40A of the silicon wafer 40 by a spin coating process by dripping an adhesive agent 41A upon the silicon wafer 40. The temporary adhesive layer 41 thus formed covers the semiconductor devices 12T or 13T formed on the top principal surface of the silicon wafer 41 and further the interconnection structure 12A or 13A including various bumps formed therewith, and because of this, the thickness of the temporary adhesive layer 41 changes variously in the range of 1 μm to 100 μm depending on the location of the wafer. It is preferable that the adhesive layer 41A has large surface tension and low viscosity. It should be noted that the formation of the temporary adhesive layer 41 is not limited to the spin coating process but may be formed also by a screen printing process or slot coating process, for example.

Figure 3E:
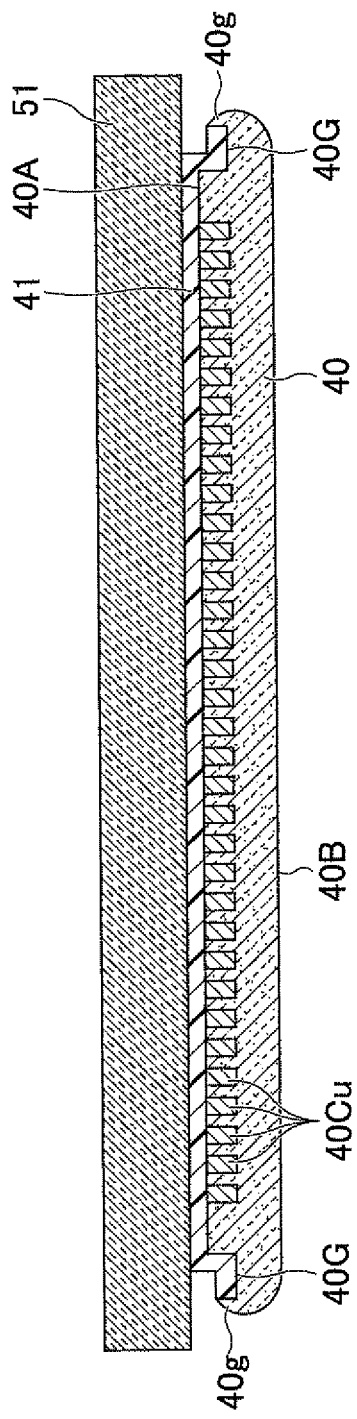

After the step of FIG. 3D, a temporary support substrate 51 of a glass, or the like, is adhered as indicated in FIG. 3E to the top principal surface 40A of the silicon wafer 40 via the temporary adhesive layer 41.

The adhesion process of the temporary substrate 51 is conducted at the temperature of 150° C. to 250° C., for example. Because the temporary adhesive layer 41 is uncured in the state of FIG. 3E, a small fraction of the adhesive 41A is pushed out or flows out from the temporary adhesive layer 41 toward a lateral side of the wafer 40 as represented schematically in FIG. 3E. In the present embodiment, in which the groove 40G is formed in the outer peripheral part 40R of the wafer 40, the adhesive 41A thus pushed out or flowed out is retailed by the groove 40G, and there occurs no such a situation in which the adhesive 41A reaches the bottom principal surface 40B of the silicon wafer 40 by flowing over the outer peripheral part 40R of the wafer 40. In the case no such a groove 40G is formed, the adhesive 41A thus pushed out or flowed out would reach the backside of the silicon wafer 40. As will be explained below, even a small amount of the adhesive 41A thus reached the backside would cause adversary effect to the process of grinding the backside of the silicon wafer 40. The adversary effect caused to the grinding process by the adhesive 41A pushed out or flowed out and reaching the backside of the silicon wafer 40 is discovered for the first time by the Applicant in the investigation that constitutes the foundation of this patent application.

Figure 3F:
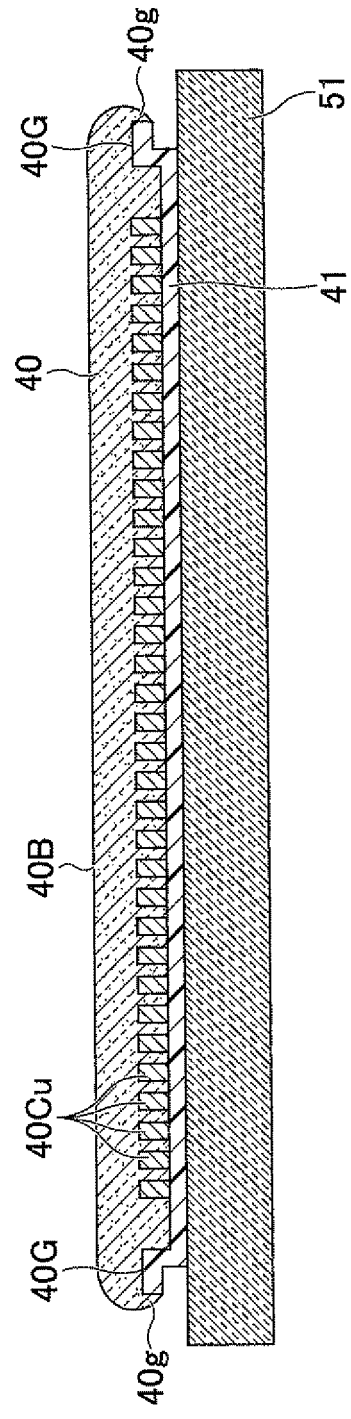

The temporary adhesive layer 41 is then cured in the process of FIG. 3E, and the silicon wafer 40 is turned over as represented in FIG. 3F in the state that temporary support substrate 51 is adhered. Further, the support substrate 51 is fixed upon a platen 150 of a grinding machine as represented in FIG. 3G and the bottom principal surface 40B of the silicon wafer 40 is grinded by a rotating grinding wheel as represented in FIG. 3G by an arrow.

Further, a dry etching process is conducted and the via-plugs 40Cu are exposed. As a result of the process of FIG. 3G, the via-plugs 40Cu constitutes a so-called through via-plug (TSV: Through Silicon Via). Hereinafter, the via-plugs 40Cu thus have become the through via-plug will be designated as "40Cu (TSV)".

In the present embodiment, there occurs no such a situation in which the uncured adhesive 41A pushed out or flowed out from the temporary adhesive layer 41 reaches the bottom principal surface 40B of the silicon wafer 40 by flowing over the outer peripheral part 40R as explained with reference to FIG. 3E, and thus, there arises no such a problem that the grinding becomes non-uniform or defect is caused in the grinding process of FIG. 3G by the resin thus flowed over the outer peripheral part 40R.

Figure 3G:
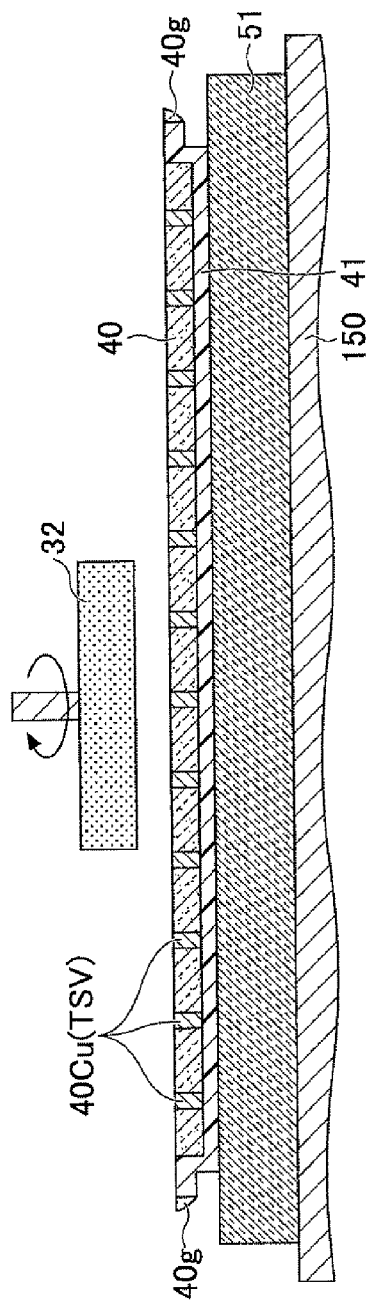

As noted previously, it is not necessary that the depth of the tip end of the via-plug 40Cu is in coincident to the depth of the bottom of the groove 40G, and thus, the tip end of the via-plug 40Cu may be not exposed or the thickness of the silicon wafer 40 may not reach the predetermined thickness of the semiconductor chip 12 or 13 in the state of FIG. 3G, in which the grinding started from the bottom principal surface 40B of the silicon wafer 40 has reached the bottom 40j of the groove 40G.

In such a case, the grinding using the grinding wheel 32 may be simply continued until the thickness of the silicon wafer 40 has become coincident to the predetermined thickness. In the process of FIG. 3G, the temporary adhesive layer 41 is already cured, and thus, there is caused no such a problem of non-uniform grinding by the uncured adhesive flowed from the temporary adhesive layer 41 as explained previously with reference to FIG. 3E.

In the step of FIG. 3G, it should be noted that the outer wall part 40g that has defined the groove 40G remains in a ring shaped form in the state connected by the temporary adhesive layer 41g. By removing the temporary adhesive layer 41 in the step of FIG. 3H by dissolving into an alkaline solvent, the silicon wafer 40 is separated from the temporary support substrate 51 and the outer wall part 40g is removed at the same time.

Figure 3H:
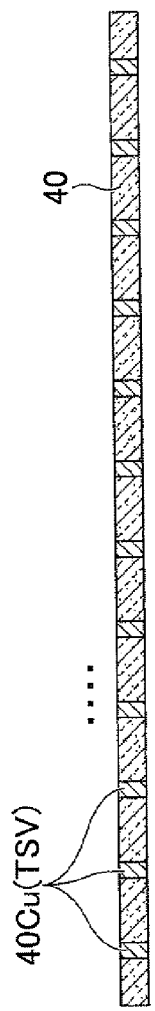

As a result of the grinding and dry etching in the process of FIG. 3G, it should be noted that the silicon wafer 40 obtained in the process of FIG. 3H has a thickness corresponding to the depth of the groove 40G.

Figure 3I:
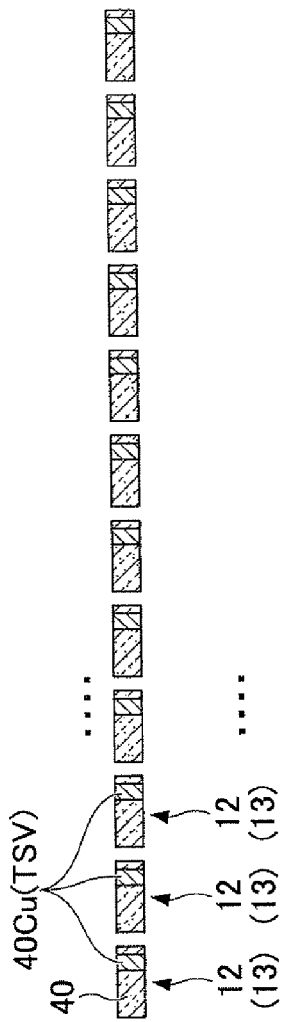

Further, the silicon wafer 40 thus obtained is diced into individual semiconductor chips 12 or 13 as represented in FIG. 3I. Further, by stacking and soldering the obtained semiconductor chips, the three-dimensional semiconductor integrated circuit device 10 of FIG. 1 is obtained.

It should be noted that the semiconductor chip 14 in the construction of FIG. 1 does not include the through via-plugs (TSV), and thus, the semiconductor chip 14 can be fabricated by ordinary manufacturing process of a semiconductor chip. Further, the semiconductor chip 14 can be mounted by a usual flip-chip mounting process. Thus, explanation for the manufacturing and flip-chip mounting of the semiconductor chip 14 is omitted. However, it should be noted that, in the manufacturing of the semiconductor chip 14, it is also possible to reduce the thickness of the silicon substrate constituting the semiconductor chip 14 may be reduced by the process similar to FIGS. 3A-3I.

Figure 6:
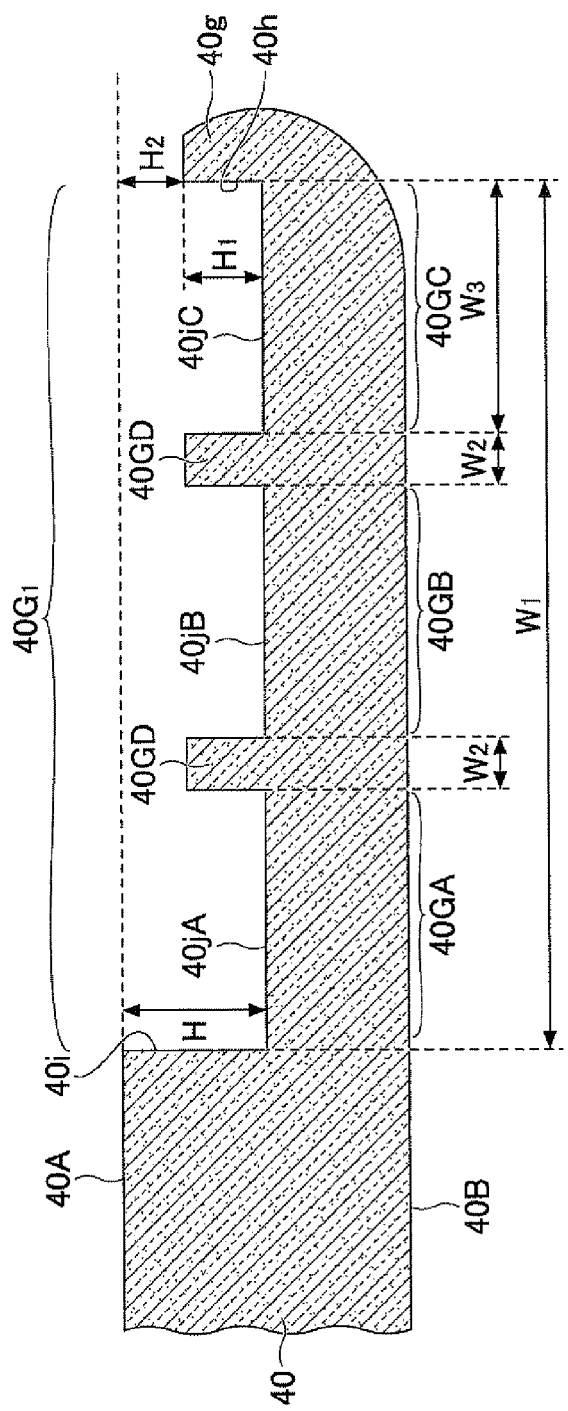
FIG. 6 is a cross-sectional diagram representing a modification of the first embodiment.

In such a case, a semiconductor wafer such as the one represented in FIG. 6 may be used in the step of FIG. 3C. The modification of FIG. 6 will be explained later.

Thus, according to the present embodiment in which the groove 40G is formed in the outer peripheral part 40R of the silicon wafer 40 such that the groove 40G is defined by the outer wall part 40g, the outer wall part 40g functions as a dam, and the adhesive 41A of the uncured state is prevented from reaching the bottom principal surface 40B of the wafer 40 after being pushed out or flowed out from the adhesive layer 41 by flowing over the outer peripheral part 40R. As a result, it becomes possible to avoid the problem in the grinding process of the bottom principal surface 40B of the silicon wafer 40 in FIGS. 3F and 3G in that the grinding process becomes unstable because of the existence of such an adhesive. As a result, it becomes possible to avoid the defects caused by the varying thickness of the silicon substrate which is obtained for the semiconductor chips 12 or 13.

Figure 4A:
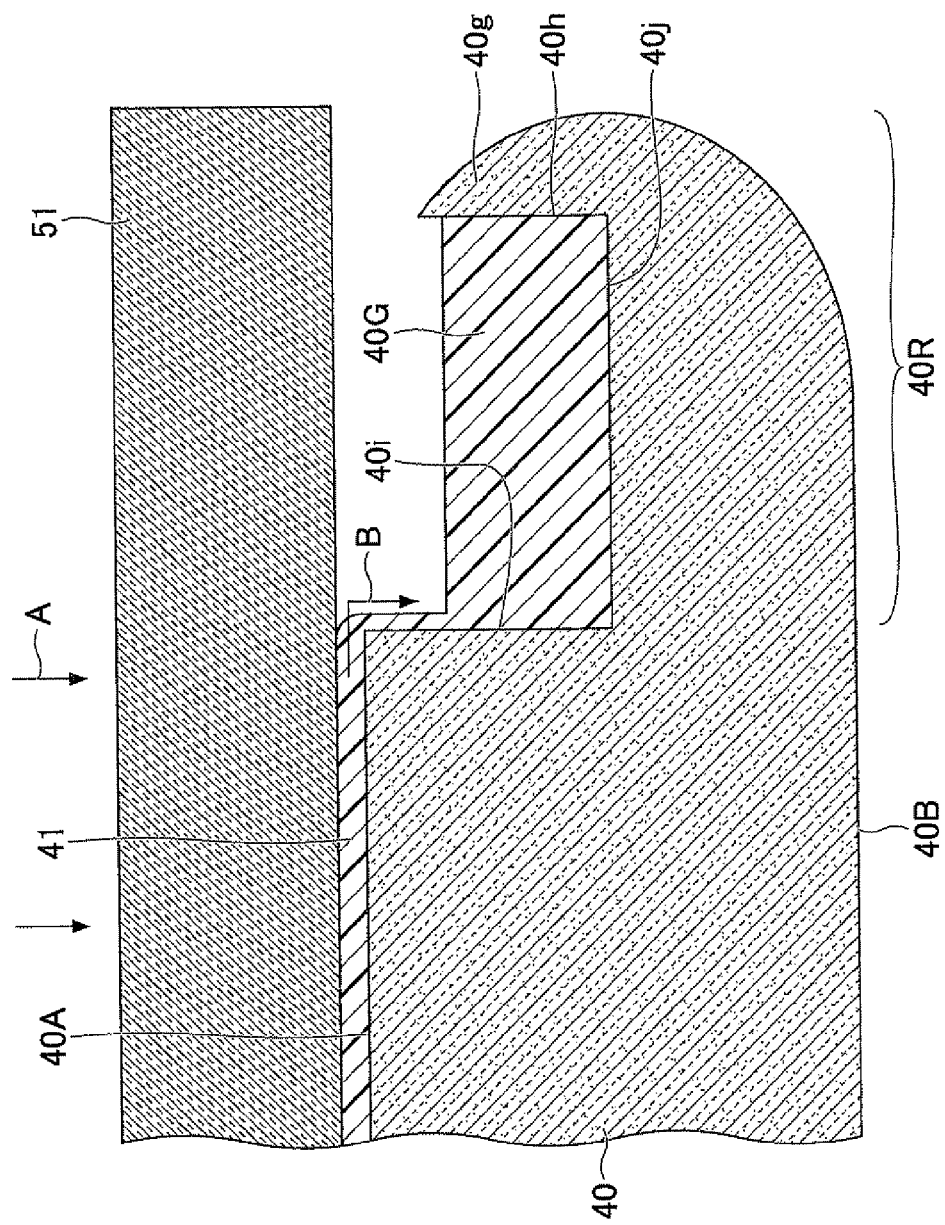
FIG. 4A is a cross-sectional diagram representing the process of FIG. 3E in detail.

FIG. 4A is an enlarged cross-sectional diagram representing the state of the outer peripheral part 40R of the step of FIG. 3E I more detail.

Referring to FIG. 4A, the temporary support substrate 51 is lightly pushed against the silicon wafer 40 as represented by an arrow A, and the uncured adhesive layer 41 is pushed out or flows out in a direction toward an outer periphery and is retained by the groove 40G formed in the outer peripheral part 40R as represented by an arrow B. Thereby, by setting the volume of the groove 40G appropriately, it is possible to avoid the overflow of the temporary adhesive 41A thus pushed out or flowed out.

Figure 4B:
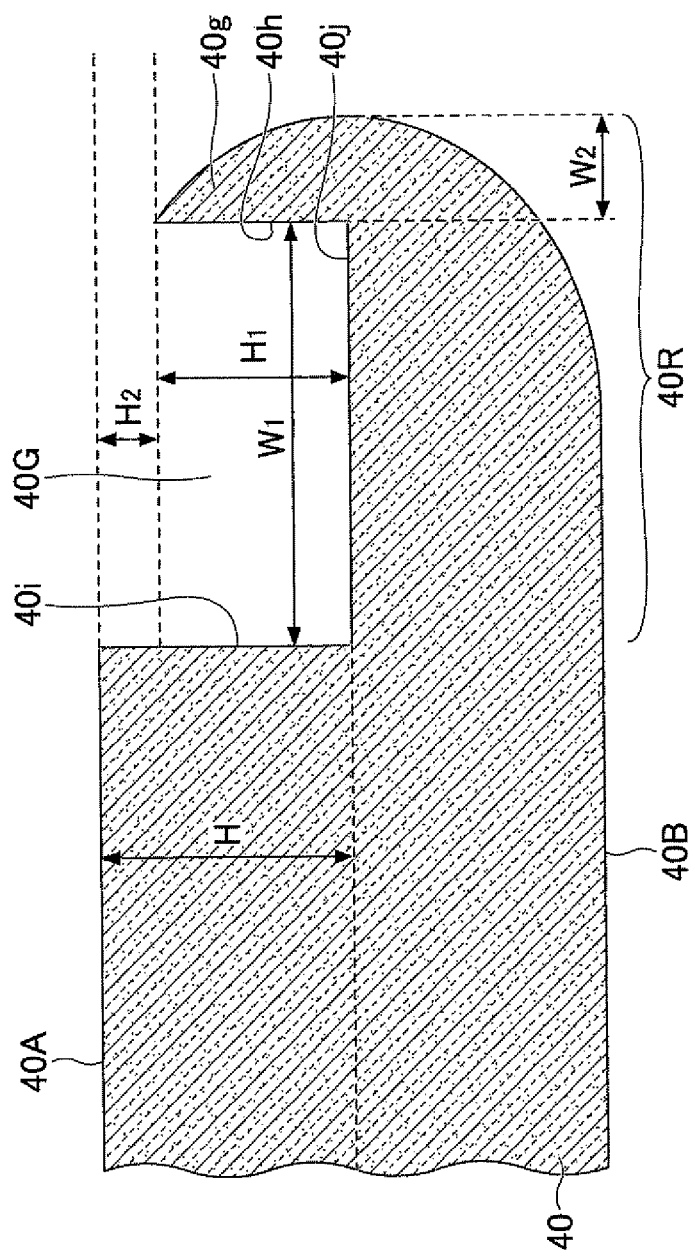
FIG. 4B is a cross-sectional diagram explaining the groove of the first embodiment in detail.

FIG. 4B is an enlarged cross-sectional diagram showing an example of the groove 40G according to the present embodiment.

Referring to FIG. 4B, the depth H as measured from the top principal surface 40A of the silicon wafer 40 to the bottom surface 40j of the groove 40G corresponds to the thickness of the semiconductor chip 12 or 13 as will be understood from the explanation of FIG. 3H made previously. Thus, the depth H is set to 50 µm-350 µm in correspondence to the thickness of the semiconductor chip 12 or 13. For example, the depth H is set to 150 µm in the case the chip thickness is 100 µm.

Further, the height $H_1$ of the outer wall part 40g is set lower than the height H of the top surface 40A of the silicon wafer 40 by a height $H_2$ such that the groove 40G does not to catch the adhesive 41A cast away by the centrifugal force in the spin coating process of FIG. 3D. Here, the height $H_2$ is preferably set in correspondence to the viscosity of the coating material and the spinning speed at the time of the spin coating process.

Further, in the cross-sectional diagram of FIG. 4B, the volume of the groove 40G of the rectangular cross-section is set so as to be able to retain the uncured adhesive pushed out or flows out at the time of bonding of the support substrate 51 without causing overflow as explained previously. Because the height $H_1$ is determined by the thickness of the silicon substrate of the semiconductor chip 12 or 13, a width $W_1$ from the sidewall surface 40h to the sidewall surface 40i is determined in correspondence to the foregoing volume.

While it is difficult to measure the exact amount of the uncured adhesive pushed out or flowed out in the step of FIG. 3E or FIG. 4A and retained in the groove 40G, it is estimated that the amount would be less than about 1% of the uncured adhesive layer 41 formed on the top principal surface of the silicon wafer 40A by the spin coating process. In the case the silicon wafer 40 is a wafer of a diameter of 30 cm, the amount of the adhesive layer 41 formed on the top principal surface 40A of the silicon wafer 40 is estimated to be 0.07 mm³ when the film thickness of the layer 41 is 1 µm and 70 mm³ when the film thickness is 100 µm. Thus, by determining the volume of the groove 40G so as to be able to catch the resin of this amount, it is possible to prevent the adversary effect of the adhesive to the grinding process of FIG. 3G even when the entire adhesive layer 41 is pushed out or flowed out.

Thus, when the depth $H_1$ is 0.06 mm and the width $W_1$ is 0.3 mm, the volume of the groove 41G becomes 16.9 mm³ while when the width $W_1$ is 1 mm, the volume becomes 56.3 mm³. Likewise, when the depth $H_1$ is 0.25 mm and the width $W_1$ is 0.3 mm, the volume of the groove 41G becomes 70.5 mm³ while when the width $W_1$ is 1 mm, the volume becomes 234.7 mm³.

Because the amount of the adhesive flows into the groove 41G is estimated to be 1% or less of the temporary adhesive layer 41, it is possible to capture the adhesive pushed out or flowed out from the uncured temporary adhesive layer 41 in the step of FIG. 3E or 4A by the groove 40G without causing overflow, by setting the height h1 to the range of 0.6 mm to 0.25 mm in correspondence to the desired thickness of the silicon substrate and by setting the width $W_1$ to the range of 0.3 mm to 1 mm.

Next, the details of the fabrication process of the three-dimensional semiconductor integrated circuit device 10 of FIG. 1, including the formation process of the semiconductor device on the silicon wafer 40 of FIG. 3C and the grinding process of FIG. 3G, will be explained with reference to FIGS. 5A to 5P.

Figure 5A:
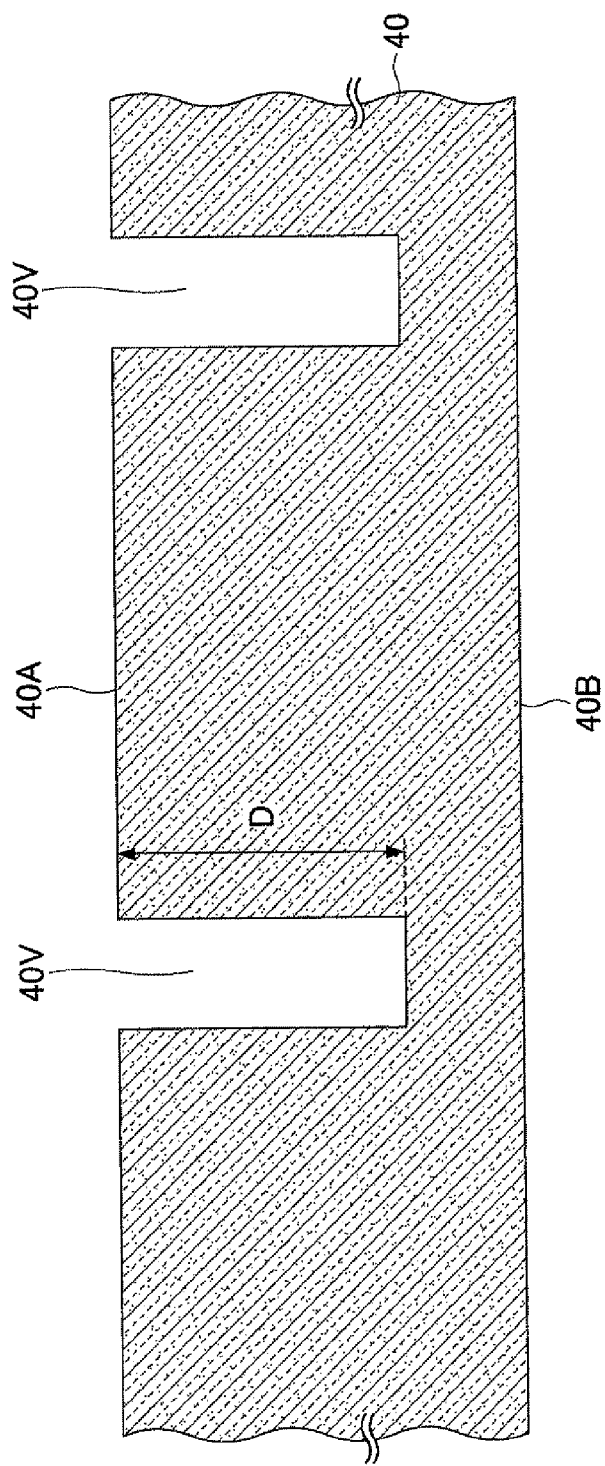
FIGS. 5A-5O are enlarged cross-sectional diagrams explaining a process of manufacturing a semiconductor device of FIGS. 1 and 2.
Figure 5B:
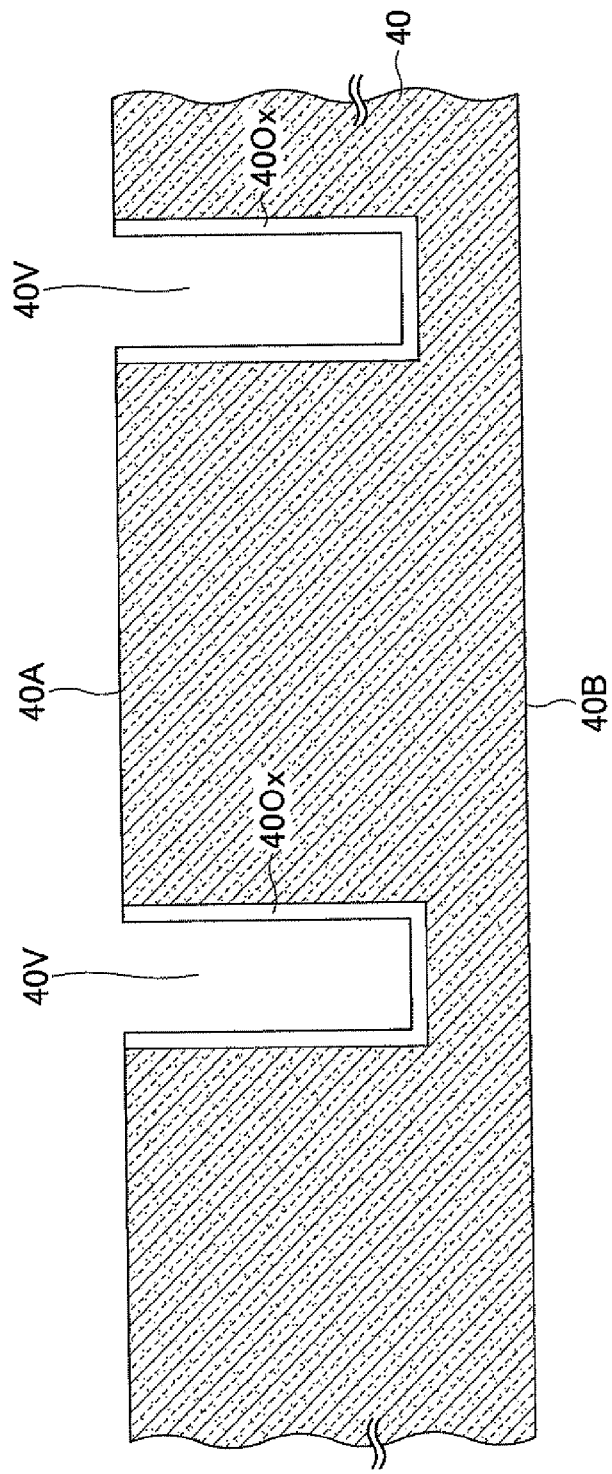

Referring to FIG. 5A, there are formed via-holes 40V on the top principal surface 40A of the silicon wafer 40 with a depth D equal to or larger than the desired thickness of the silicon substrate of the semiconductor chip 12 or 13, and a silicon oxide film 40Ox is formed to cover the bottom surface and the sidewall surface of the via-hole 40V as represented in FIG. 5B by conducting a thermal oxidation process.

Figure 5C:
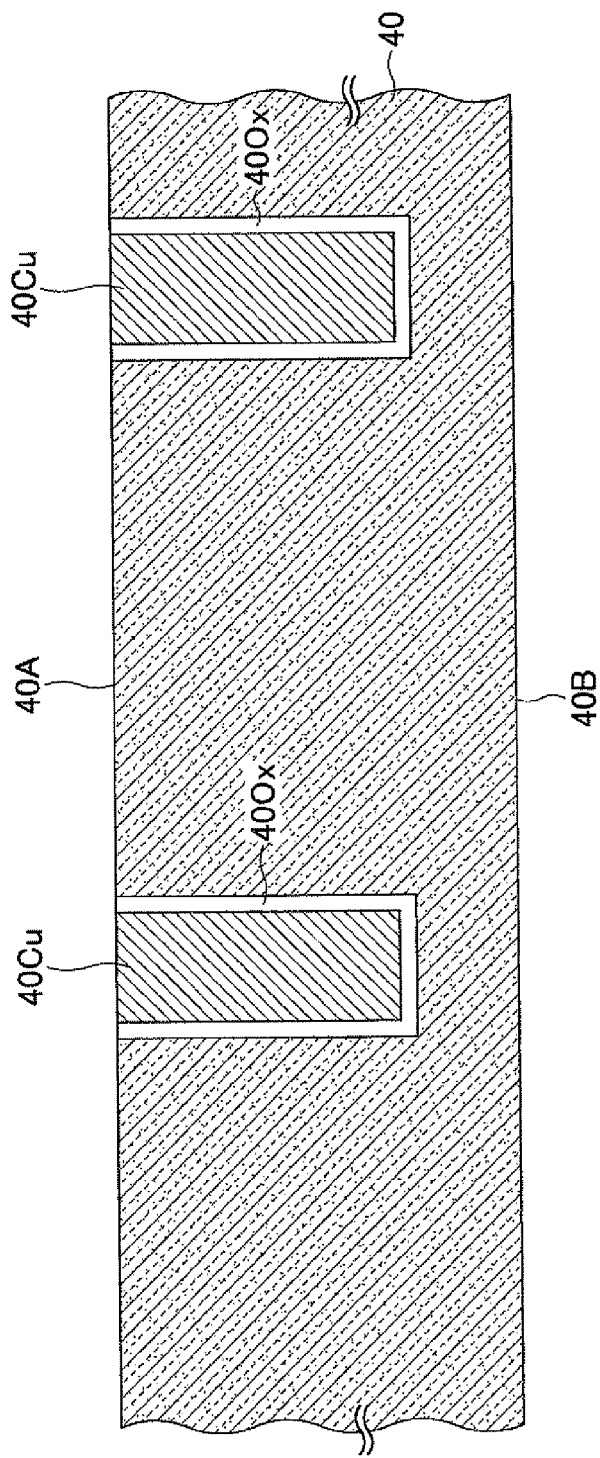

Further, by forming a plating seed layer of copper or the like not illustrated on the silicon oxide film 40Ox by a sputtering process or non-electrolytic plating process and further by conducting an electrolytic plating process by feeding an electric current to the plating seed layer in a plating bath, the via-holes 40V are filled with the via-plugs 40Cu as represented in FIG. 5C.

Figure 5D:
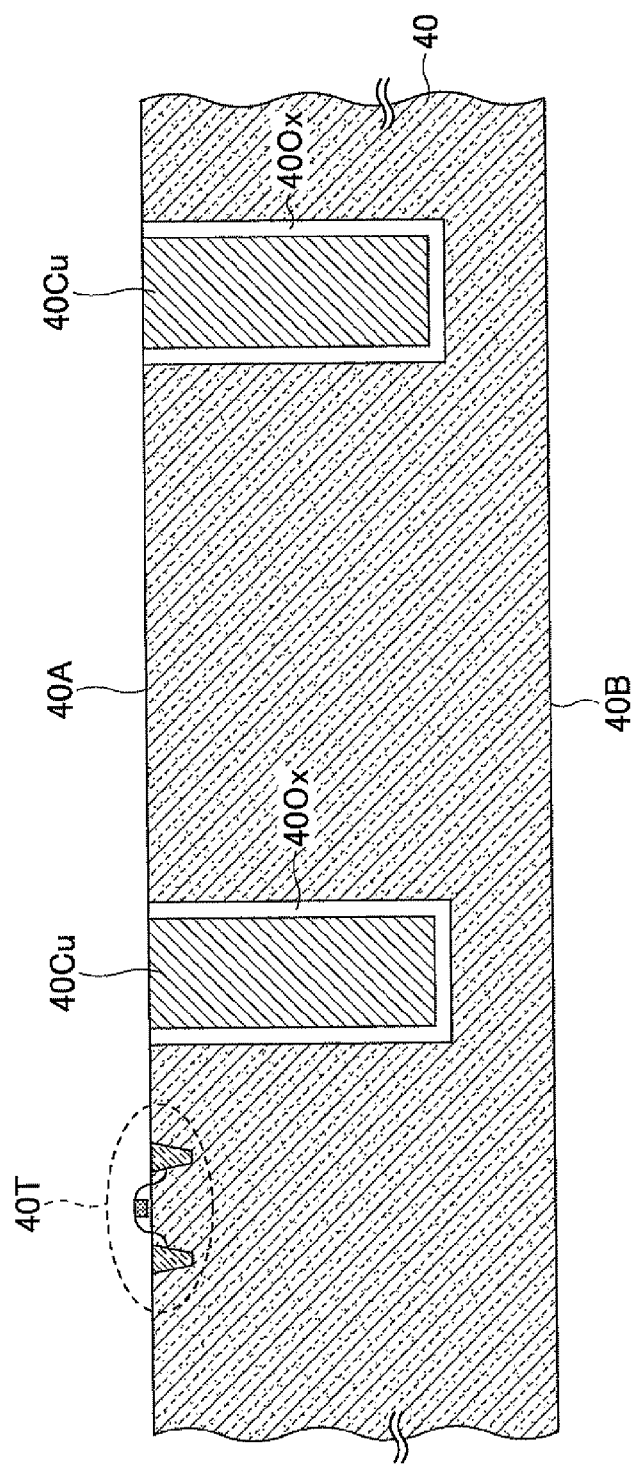
Figure 5E:
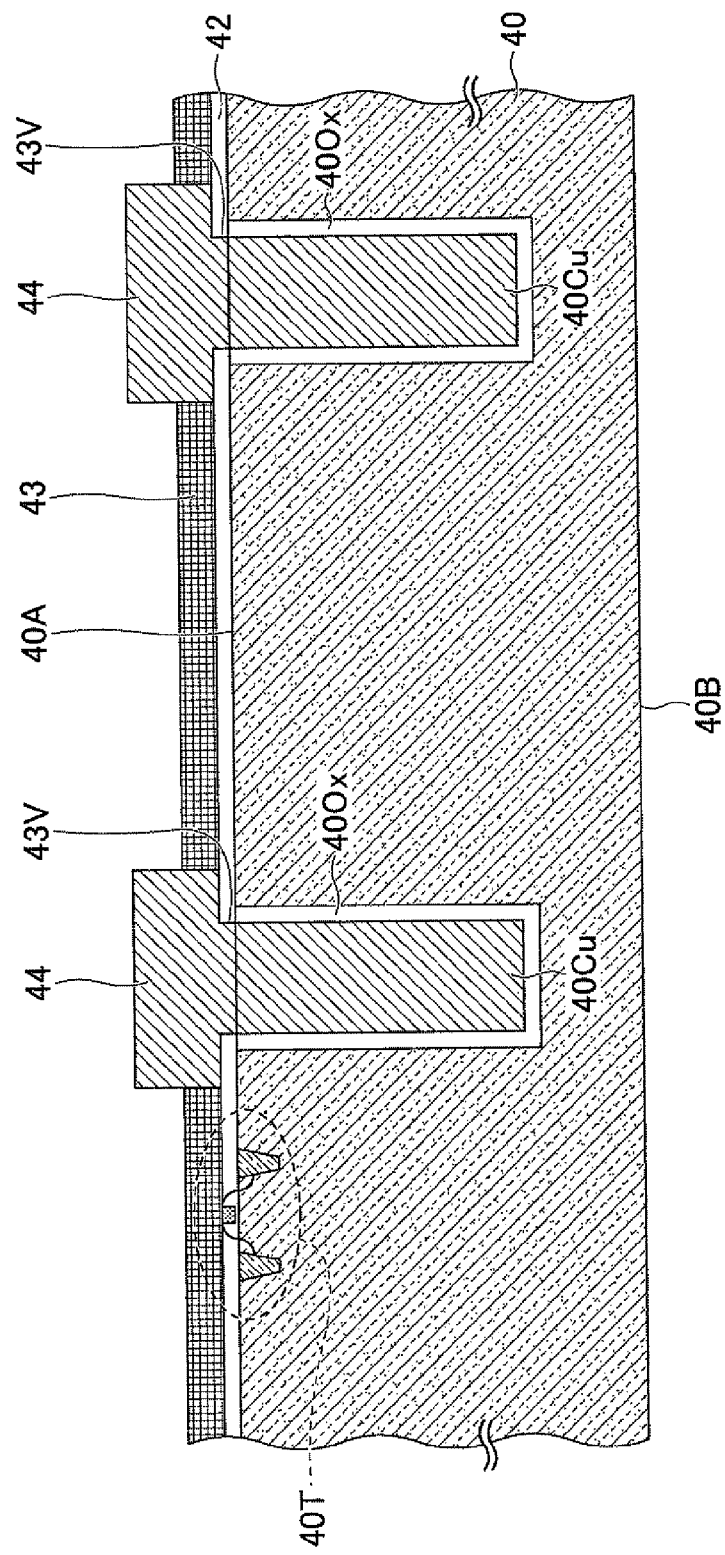

Further, a semiconductor device 40T of a MOS transistor or the like is formed on the top principal surface of the silicon substrate 40 in correspondence to the semiconductor device 12T or 13T as represented in FIG. 5D, the semiconductor device 40T is covered with an insulation film 42 corresponding to the silicon oxide film 12Ox or 13Ox, and a multilayer interconnection structure 43 corresponding to the multilayer interconnection structure 12A or 13A is formed on the insulation film 42.

As noted previously, the multilayer interconnection structure 43 is formed by stacking a large number of wiring layers via interlayer insulation films and each wiring layer includes a connection pad corresponding to the via-plug 40Cu by a copper pattern as a part of the wiring pattern. These connection pads are connected electrically as well as mechanically to an upper connection pad or lower connection pad by a large number of via-plugs, and thus, the connection pads 44 are actually formed by stacking of such large number of connection pads not illustrated. In each wiring layer, the connection pad and the via-plugs are formed easily by a dual damascene process. Further, according to the needs, there are formed a barrier film or adhesion film on such interconnection pads 44.

Figure 5F:
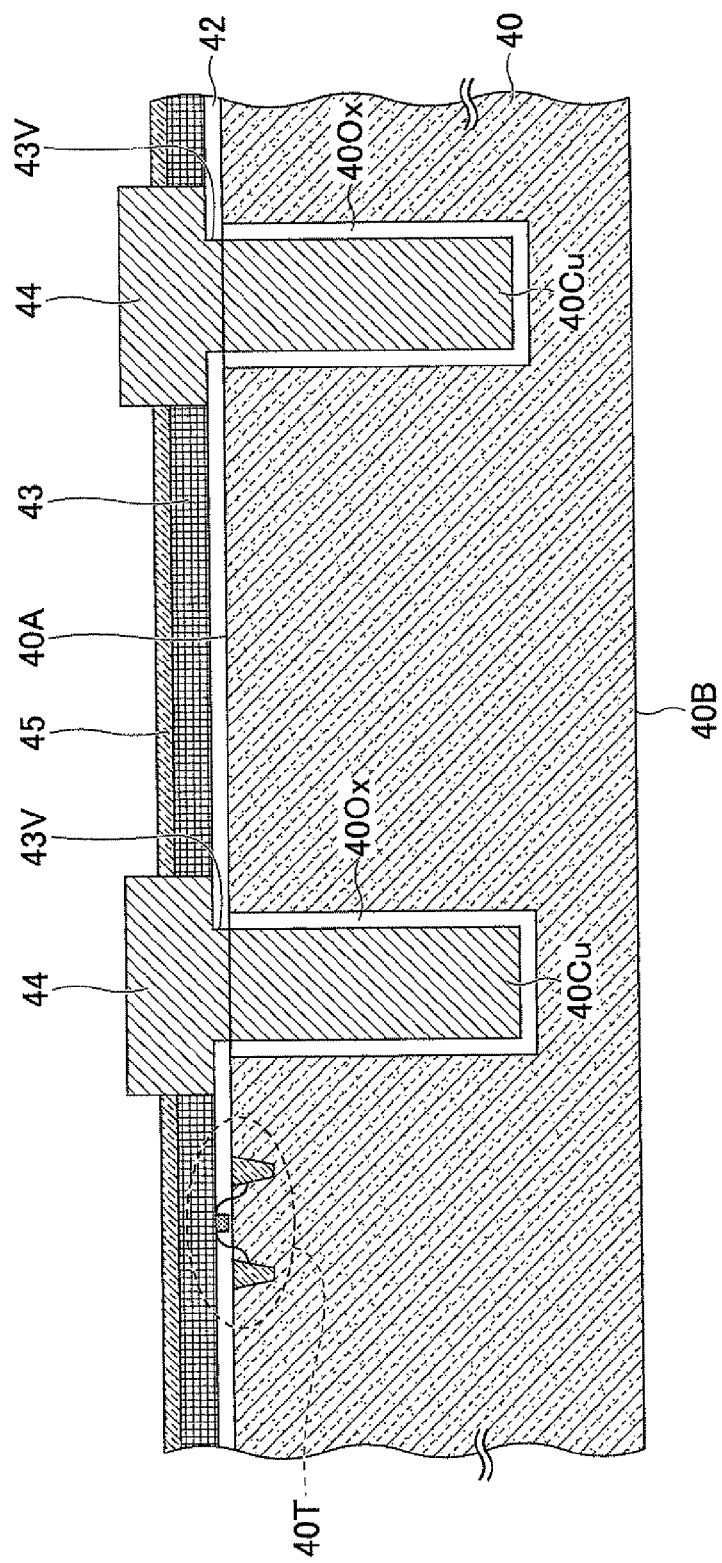

Next, a protective film 45 of silicon nitride or polyimide is formed in correspondence to the protective film 12P or 13P as represented in FIG. 5F such that the protective film 45 covers the multilayer interconnection structure 43. The protective film 45 thus formed may cover the sidewall surface and further a part of the top surface of the connection pad 44.

Figure 5G:
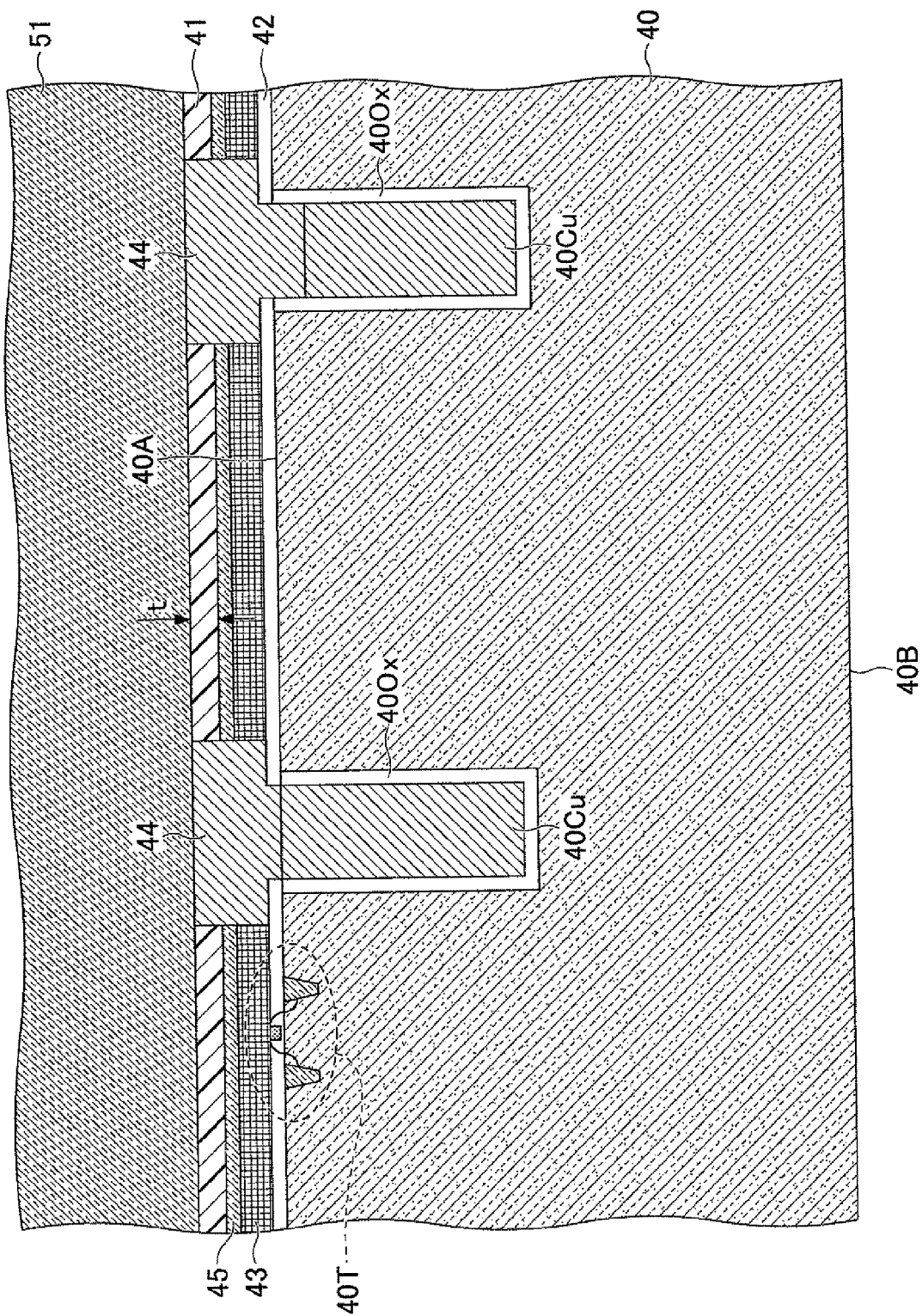

Further, in the step of FIG. 5G, the foregoing temporary adhesive layer 41 is applied on the structure of FIG. 5F by a spin coating process in correspondence to the steps of FIGS. 3D and 3E, and the temporary support substrate 51 is bonded to the temporary adhesive layer 41. Because the groove 40G is formed in the outer peripheral part 40R of the silicon wafer 40 with the present embodiment, there occurs no such a situation in which the adhesive 41A pushed out or flowed out from the temporary adhesive layer 41 reaches the bottom principal surface 40B of the silicon wafer 40 after flowing over the outer peripheral part 40R. As noted previously, the thickness t of the temporary adhesive layer 41 changes variously in the range of 1 µm to 100 µm in view of the fact that the top principal surface 40A of the silicon wafer 40 is formed with a projection and depression structure by the semiconductor device 40T, the multilayer interconnection structure 43 and further the connection pads 44.

Figure 5I:
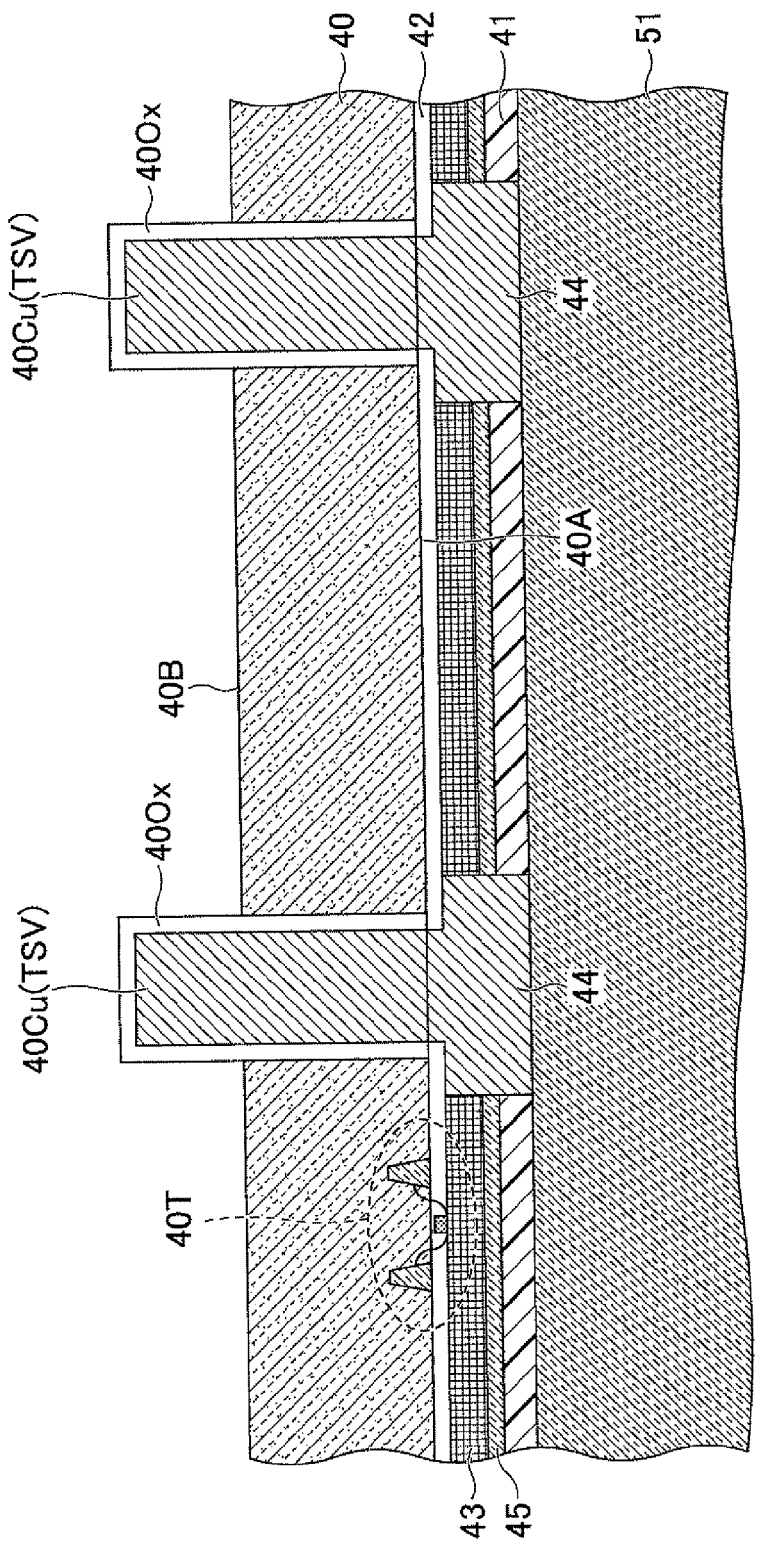

Further, as represented in FIG. 5H, the structure of FIG. 5G is turned over and the bottom principal surface 40B of the silicon wafer 40 is grinded by a grinding process corresponding to FIG. 3G as represented in the drawn by an arrow. In the step of FIG. 5H, it should be noted that the support substrate 51 is held on a platen 150 of the grinding machine represented previously in FIG. 3G. The grinding process of FIG. 5H is cut off shortly before the exposure of the thermal oxide film 40Ox covering the top end of the via-plug 40Cu, and the silicon wafer is etched back selectively with regard to the thermal oxide film 40Ox by a dry etching process such as a reactive ion etching as represented in FIG. 5I. With this, the thickness of the silicon wafer 40 is adjusted to the thickness of the silicon substrate for the semiconductor chip 12 or 13.

In the state of FIG. 5I, it should be noted that the bottom principal surface 40B of the silicon substrate 40 corresponds to the opposing surface 12DKT of the semiconductor chip or the opposing surface 13DKT of the semiconductor chip 13 in FIG. 2, while the top principal surface 40A corresponds to the bottom surface 12CKT of the semiconductor chip 12 or the circuit formation surface 13CKT of the semiconductor chip 13. As a result of the etchback process of FIG. 5I, there appears a structure in which the via-plug 40Cu projects in the upward direction from the bottom principal surface 40B of the silicon wafer 40 in correspondence to the structure of FIG. 2 and the via-plug 40Cu transforms itself to the through via-plug (TSV).

Figure 5J:
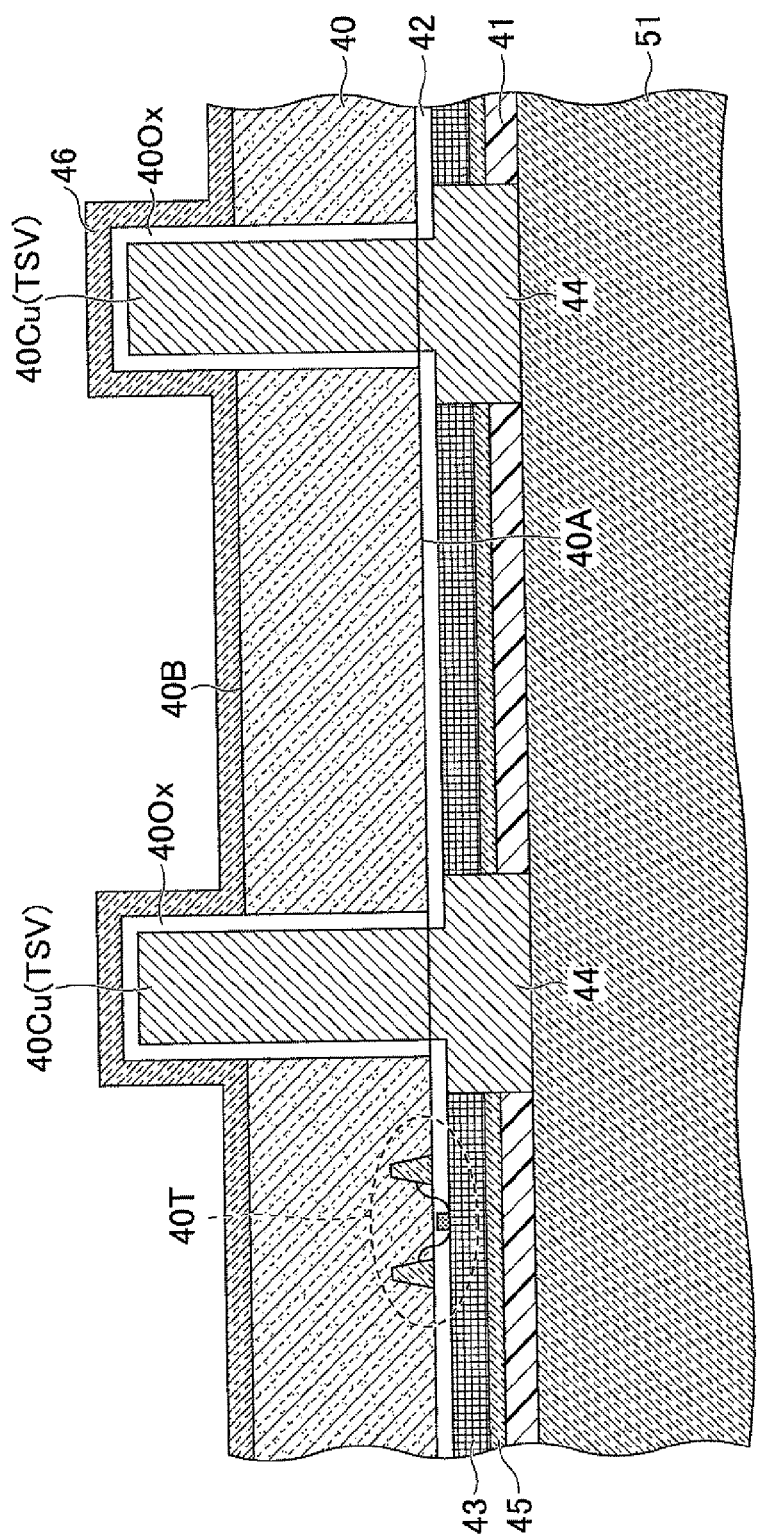

Further, in the step of FIG. 5J, there is formed a protective film 46 of a silicon nitride film, for example, on the bottom principal surface 40B of the silicon wafer 40 in correspondence to the protective film 12Q or 13Q of the structure of FIG. 2 so as to cover the projected part of the through-via plug 40Cu (TSV) via the thermal oxide film 40Ox.

Figure 5K:
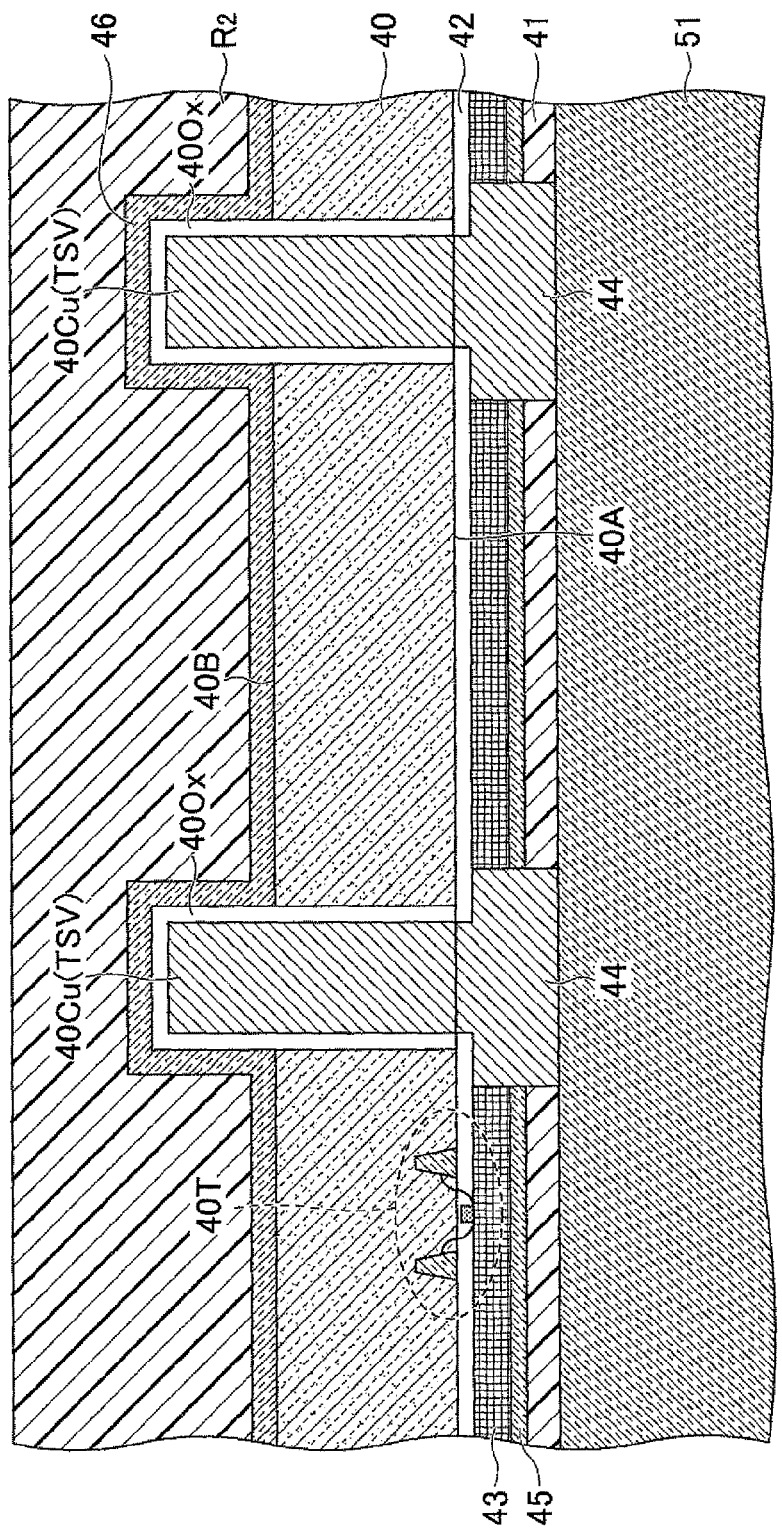

Further, as represented in FIG. 5K, there is formed a resist film R2 on the structure obtained by the process of FIG. 5J by a spin coating process so as to cover the projecting part of the through via-plug 40Cu (TSV).

Figure 5L:
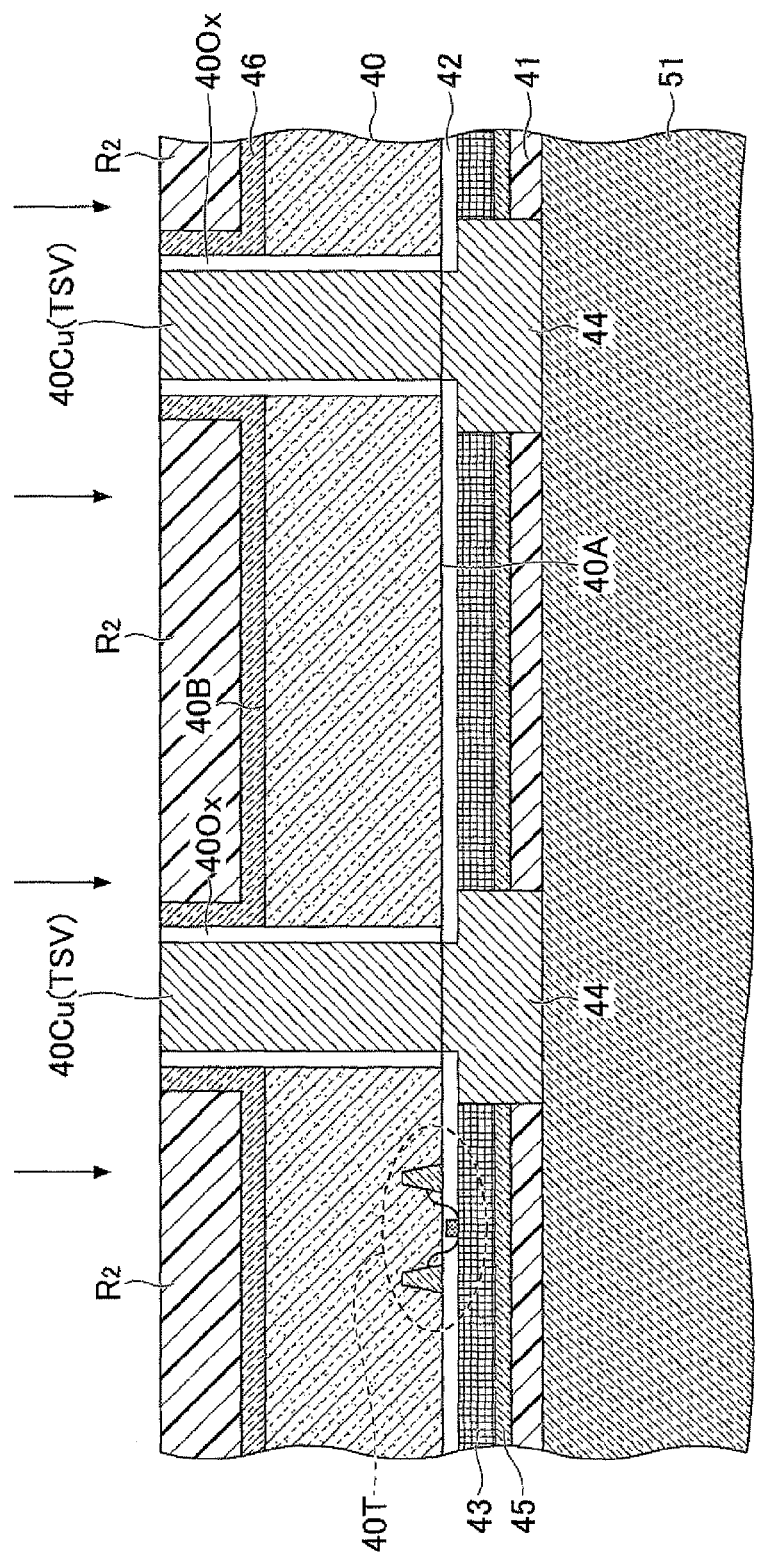

The resist film $R_2$ has a flat principal surface, and the present embodiment further etches back the resist film $R_2$ by applying a dry etching process to the structure of FIG. 5K as represented in FIG. 5L schematically by an arrow. As a result of the dry etching process, the insulation film 46 and the thermal oxide film 40Ox on the tip end part of the through-via plug 44Cu (TSV) are removed simultaneously by a generally equal etching rate, and the tip end of the through via-plug 44Cu (TSV) is exposed.

Figure 5M:
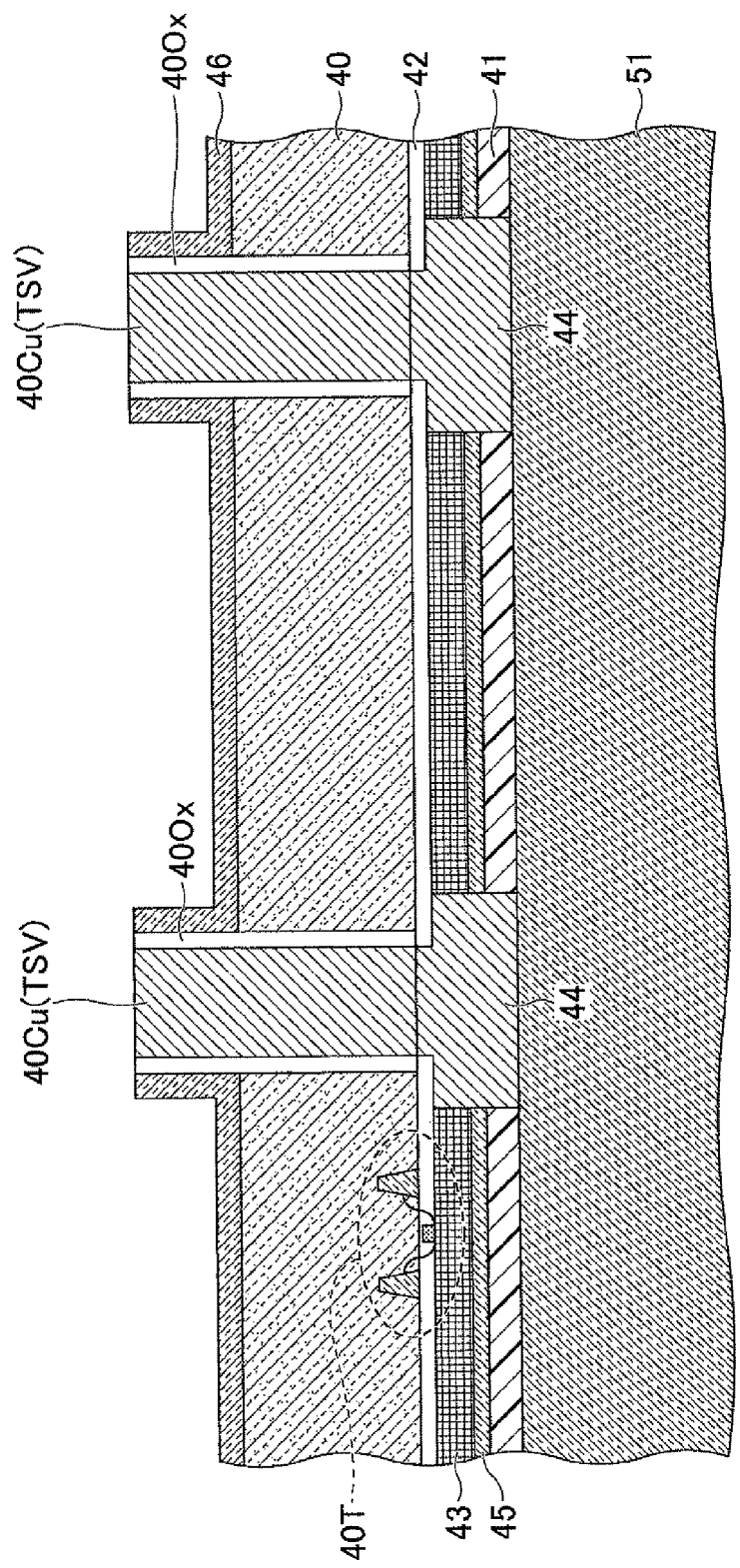
Figure 5N:
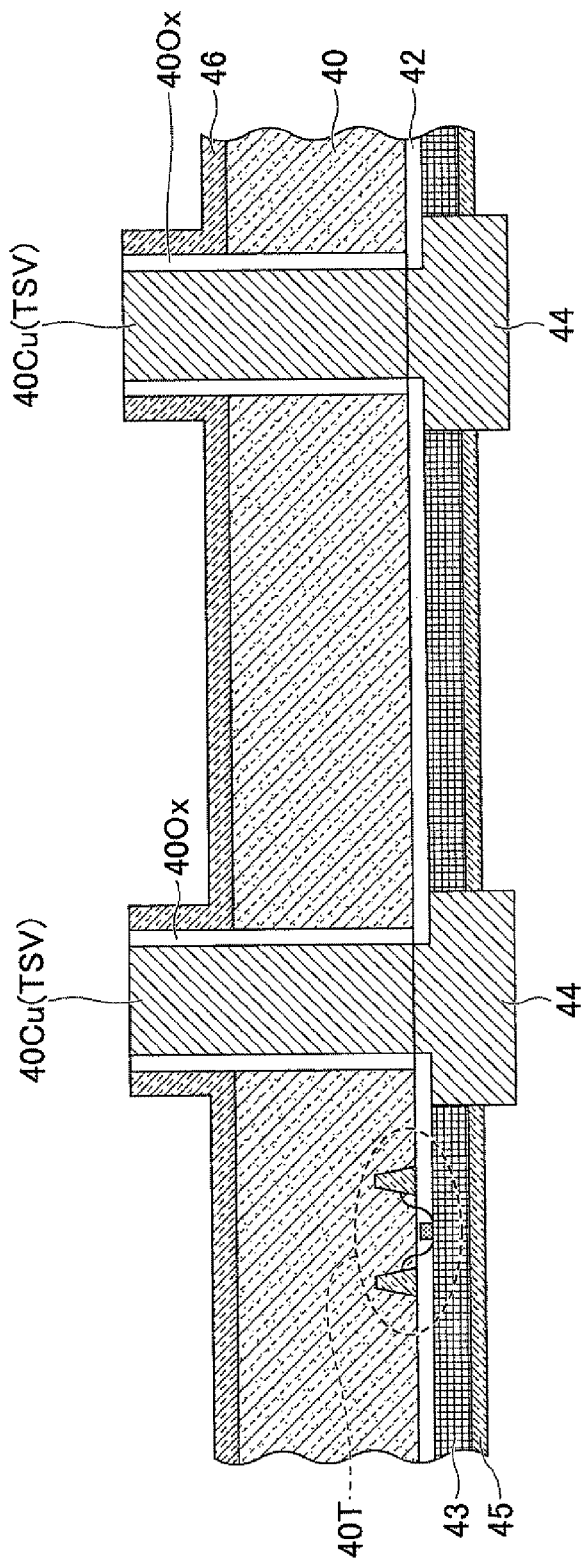
Figure 50:
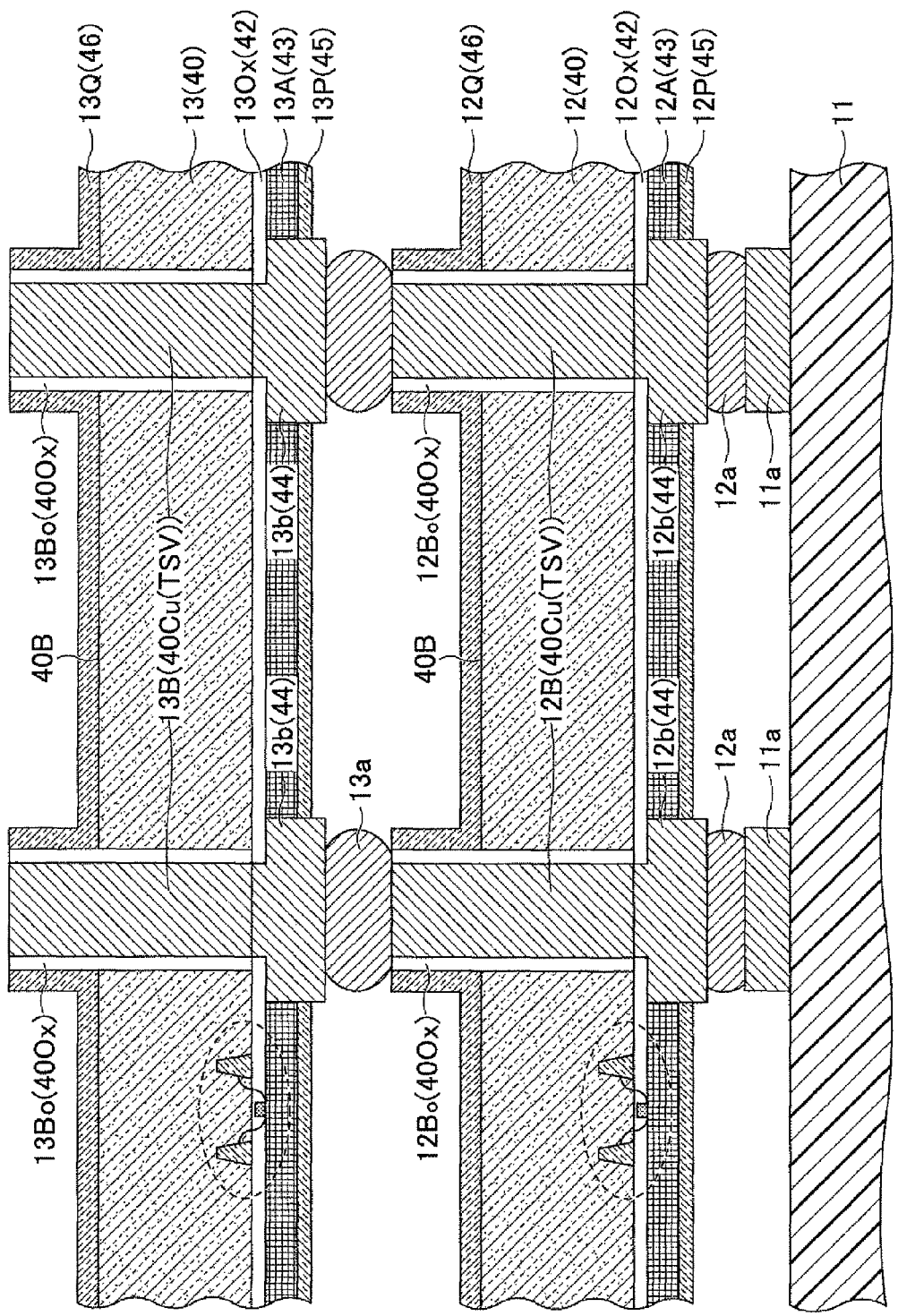

Further, as represented in FIG. 5M, the remaining resist film $R_2$ is removed, and the support substrate 51 is removed as represented in FIG. 5N.

Further, the structure obtained in the step of FIG. 5N is diced in the process of FIG. 3I, and the obtained semiconductor chips 12, 13, or the like, are stacked on the package substrate 11. Further, by solder bonding the semiconductor chips 12, 13 and the like, a structure represented in FIG. 5O is obtained. In FIG. 5O, it should be noted that the illustration of the semiconductor chip 14 is omitted.

Further, by sealing the spaces formed between the semiconductor chips 12, 13 and 14 with the sealing resins 12R, 13R, 14R, and the like, the three-dimensional semiconductor integrated circuit device 10 of FIGS. 1 and 2 is obtained.

While the present embodiment forms the copper via-plugs 33Cu first and then the semiconductor device 40T in the step of FIG. 3C as explained with reference to FIGS. 5A-5D, it is also possible to form the semiconductor device 40T first by conducting the process of FIG. 5D and then form the copper via-plugs 44Cu by conducting the process of FIGS. 5A-5C.

FIG. 6 is a cross-sectional diagram representing the construction of the groove $40G_1$ according to a modification of the present embodiment.

Referring to FIG. 6, the groove $40G_1$ is defined by the outer wall surface 40i of the main part 40M and the opposing inner wall surface 40h of the outer wall part 40g similarly to the groove 40G, except that there are formed projecting stepped parts 40GD in the groove 40G1 with a width $W_2$ such that the groove $40G_1$ is divided into a groove part 40GA having a bottom surface 40jA, a groove part 40GB having a bottom surface 40jB and a groove part 40GC having a bottom surface 40jC. Thus, the adhesive 41A pushed out or flowed out from the temporary adhesive layer 41 formed on the top principal surface 40A is retained first in the groove part 40GA, and when the adhesive has caused overflow in the groove part 40GA, the adhesive is retained by the next groove part 40GB. Further, when the adhesive has caused overflow in the groove 40GB, the adhesive 41A is retained by the lasset groove part 40GC.

With the construction of FIG. 6, too, it is possible to secure a sufficient value for the total volume of the groove parts 40GA-40GC by setting the widths $W_1$ and $W_2$ appropriately in correspondence to the depth $H_1$ of the groove parts 40GA-40GC, and it becomes possible to avoid the problem of the adhesive 41A pushed out or flowed out from the temporary adhesive layer 41 to reach the backside and hence the bottom principal surface 40B of the silicon wafer 40.

Figure 7:
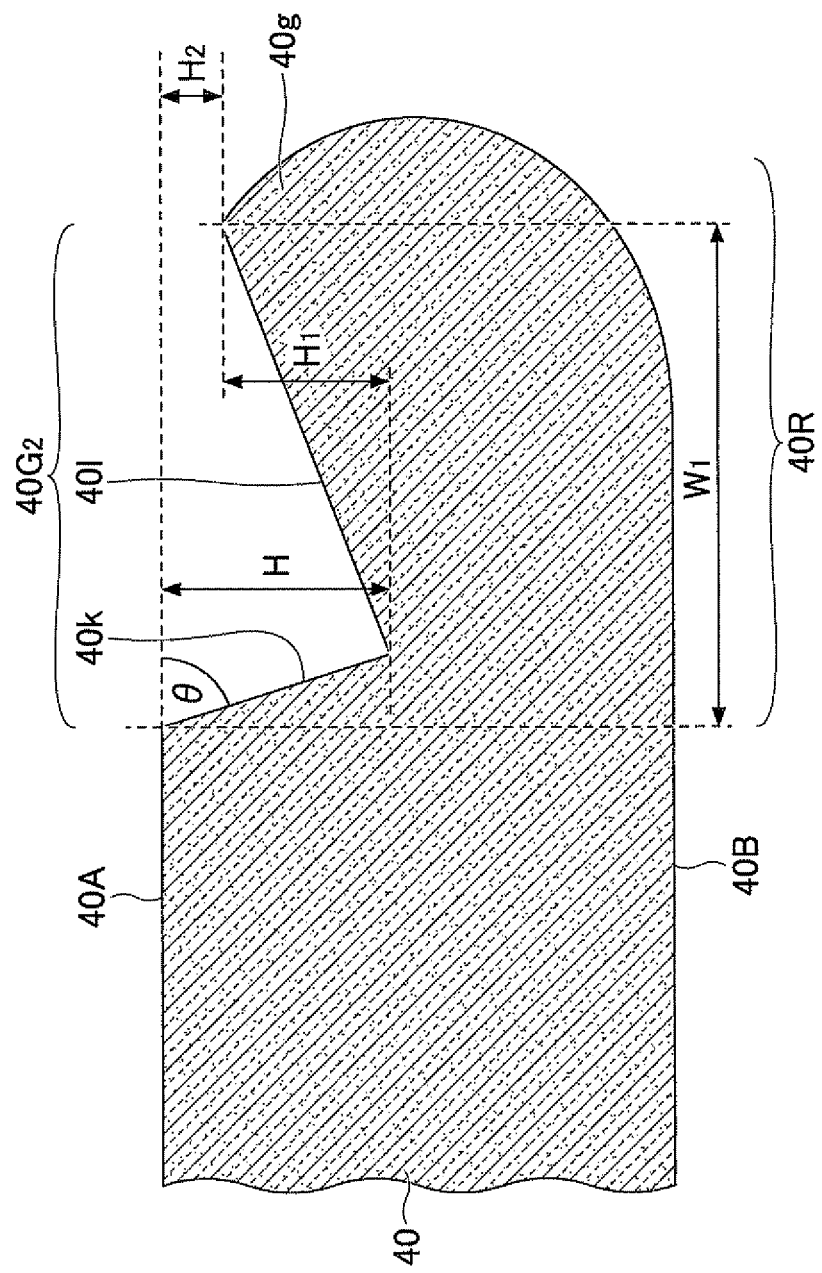
FIG. 7 is a cross-sectional diagram representing another modification of the first embodiment.

FIG. 7 is a cross-sectional diagram representing the construction of a groove $40G_2$ according to another modification of the present embodiment.

Referring to FIG. 7, the groove $40G_2$ is defined by two sloped surfaces 40k and 40l crossing perpendicularly.

Because the bottom surface 40l is inclined with the present embodiment, the depth of the groove $40G_2$ changes depending upon the distance from the outer wall part 40g, wherein the depth H at the deepest part is set to correspond to the thickness of the silicon substrate of the desired semiconductor chip. Further, by setting the width $W_1$ and the angle θ of the sloped surface 40k with regard to the top principal surface 40A of the silicon substrate 40 appropriately, it becomes possible to secure a sufficient volume for the groove $40G_2$, and it becomes possible to prevent the adhesive 41A pushed out or flowed out from the temporary adhesive layer 41 in the step of FIG. 3E from reaching the backside and hence the bottom principal surface 40B of the silicon wafer 40.

Figure 8:
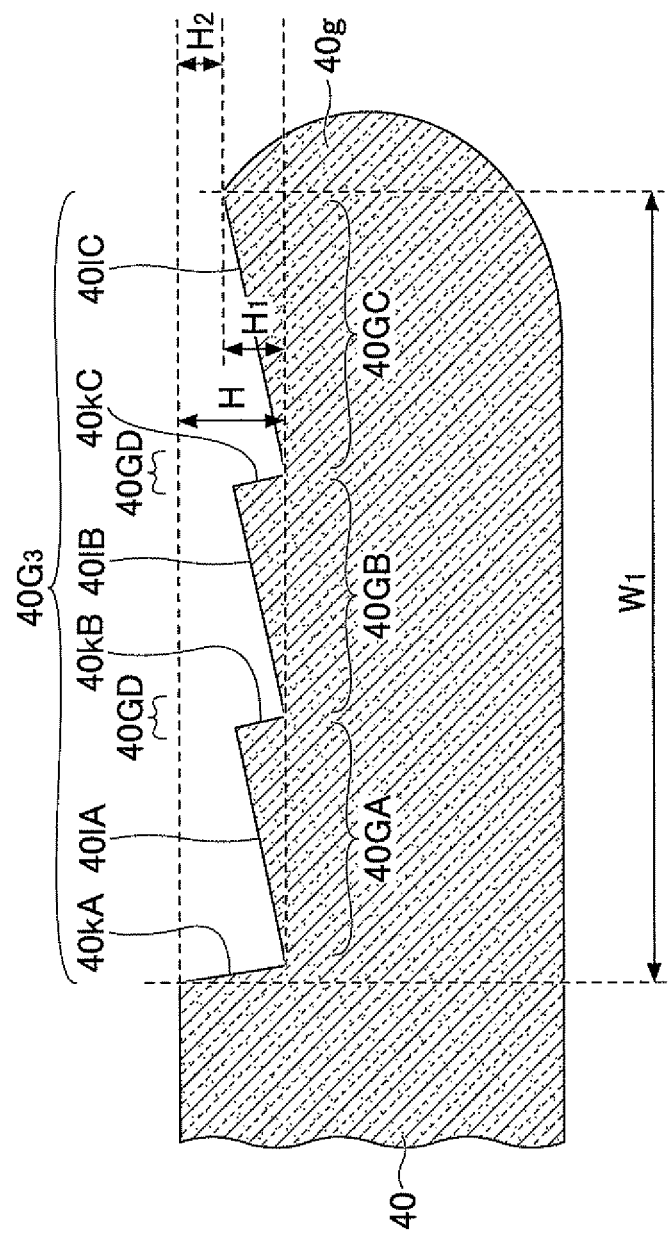
FIG. 8 is a cross-sectional diagram representing further modification of the first embodiment.

FIG. 8 is a cross-sectional diagram representing the construction of a groove $40G_3$ according to a modification of the present embodiment.

Referring to FIG. 8, the present embodiment is a modification of the groove $40G_2$ of FIG. 7 in that there are formed regions 40GA, 40GB and 40GC respectively having sloped surfaces 401A, 401B and 401C in place of the sloped surface 40l in a matter separated by stepped parts 40GD formed of sloped surfaces 40 kB and 40kC. Thus, the region 40GA is defined by the sloped surface 40kA and the sloped surface 401A while the region 40GB is defined by the sloped surface 40kB and the sloped surface 401B, and the region 40GC is defined by the sloped surface 40kC and the sloped surface 401C. The sloped surfaces 40kA, 40kB and 40kC form steep bumps.

With such a structure, too, it becomes possible to secure a sufficient total volume for the groove $40G_3$ by setting the angle θ of the sloped surface 40k with regard to the top principal surface 40A of the silicon substrate 40 appropriately and by setting the lengths of the respective sloped surfaces 401A, 401B and 401C appropriately, and it becomes possible to prevent the adhesive 41A pushed out or flowed out from the temporary adhesive layer 41 in the step of FIG. 3E from reaching the backside and hence the bottom principal surface 40B of the silicon wafer 40.

Thus, according to the foregoing embodiment, it becomes possible, by forming the groove to the first principal surface of the semiconductor wafer so as to extend along the outer periphery of the semiconductor wafer, to capture the adhesive that has been pushed out and entered into such a groove or has flowed into the groove at the time the support substrate is bonded to the first principal surface via the adhesive layer before starting the grinding of the second principal surface opposite to the first principal surface, and the adhesive does not reach the second principal surface of the semiconductor wafer, to which the grinding is made, by flowing across the outer periphery.

[Second Embodiment]

In the previous embodiment, it has been noted that it is also possible to apply the technology of reducing the thickness of the silicon wafer constituting a semiconductor chip also to the manufacturing of a semiconductor device not containing a through via-plug (TSV), as in the case of the semiconductor chip 14, by forming the groove in the outer peripheral part of the silicon wafer and grinding the backside of the silicon wafer while preventing the adhesive from reaching the backside of the silicon wafer by way of flowing over the wafer edge while using the groove.

Figure 9A:
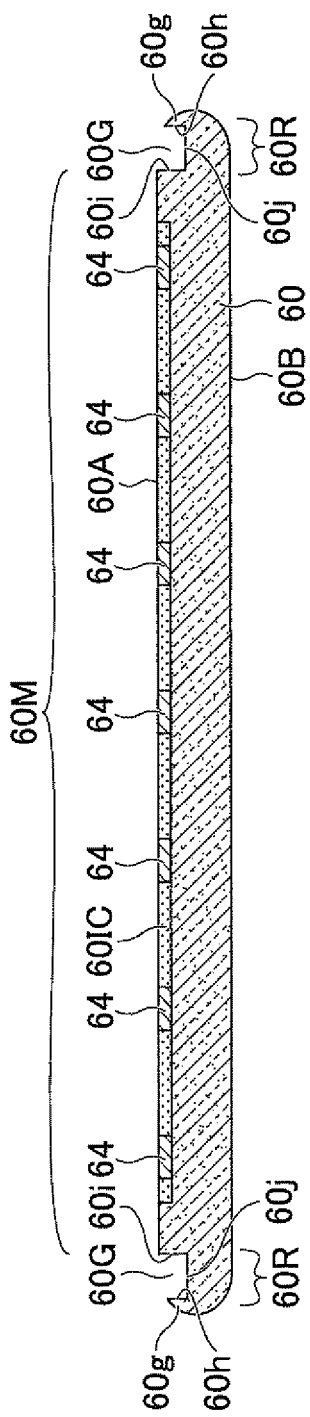

FIG. 9A is a cross-sectional diagram representing a silicon wafer 60 formed with a semiconductor device not including such a through via-plug (TSV).

Referring to FIG. 9A, the silicon wafer 60 is formed of a main part 60M having a flat top principal surface 60A similar to the silicon wafer 40 of the previous embodiment and an outer peripheral part 60R having a rounded edge and formed at the outer periphery of the main part 60M, wherein the main part 60M is formed with a semiconductor integrated circuit device 60IC on the top principal surface 60A by a large number of semiconductor devices and multilayer interconnection structures. The semiconductor integrated circuit device 60IC is formed of a large number of transistors and a multilayer interconnection structure connecting the transistors electrically and is divided into device regions corresponding to the respective semiconductor chips by scribe lines. Further, the semiconductor integrated circuit device 60IC includes a large number of connection pads 64.

In the present embodiment, too, the outer peripheral part 60R is formed with a groove 60G in correspondence to the groove 40G wherein the groove 60G is formed of an outer wall part 60g constituting the outermost periphery of the silicon wafer 60, an outer wall surface 60i of the wafer main part 60M opposing to an inner wall surface 60h of the outer wall part 60g and a bottom surface 60j connecting the inner wall surface 60h and the outer wall surface 60i.

The groove 60G may be formed in advance of the formation of the semiconductor integrated circuit device 60IC or may be formed after the formation of the semiconductor integrated circuit device 60IC. In the case the groove 60G is formed in advance of the semiconductor integrated circuit device 60IC, it is possible to avoid the effect of particles to the semiconductor integrated circuit device 60IC by conducting cleaning thoroughly after the formation of the groove 60G. Further, in the case the groove 60G is formed after the formation of the semiconductor integrated circuit device 60IC, it becomes possible to avoid the problem of deposition of various insulation layers and metal layers in the groove 60G at the time of formation of the semiconductor integrated circuit device 60IC.

Figure 9B:
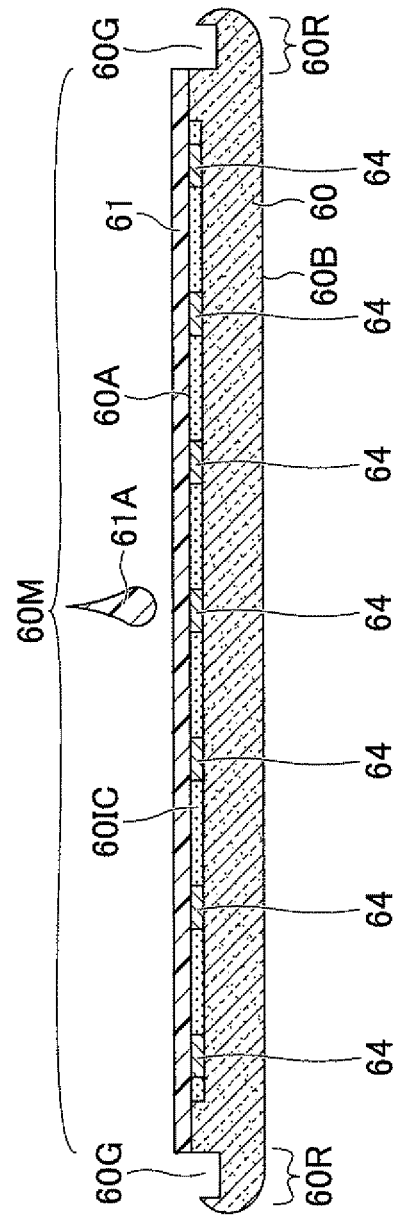
Figure 9C:
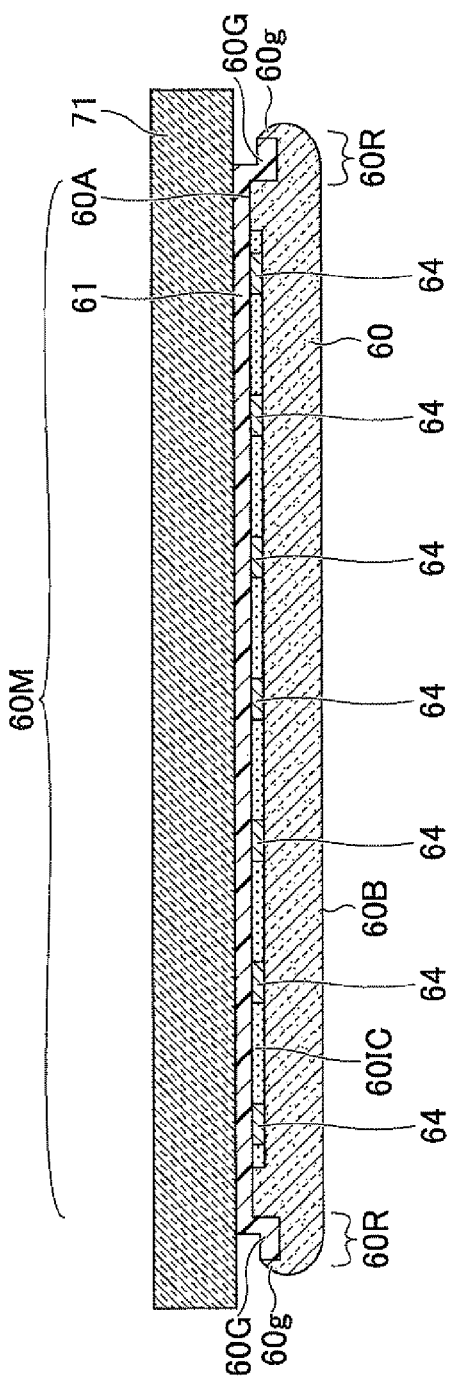

In the present embodiment, there is formed a temporary adhesive layer 61 as represented in FIG. 9B in correspondence to the process of FIG. 3D by spin coating an adhesive 61A upon a top principal surface 60A of the silicon wafer 60, and a support substrate 71 similar to the support substrate 50 of FIG. 3E is bonded upon the temporary adhesive layer 61 as represented in FIG. 9C in the state the temporary adhesive layer 61 is not cured. Thereby, the adhesive 61A pushed out or flowed out from the temporary adhesive layer 61 associated with the bonding of the support substrate 71 is captured by the groove 60G also in the present embodiment, and there occurs no such a situation in which the adhesive 61A reaches the bottom principal surface 60B of the silicon wafer 60 to be grinded later by flowing over the outer peripheral part 60R.

Figure 10:
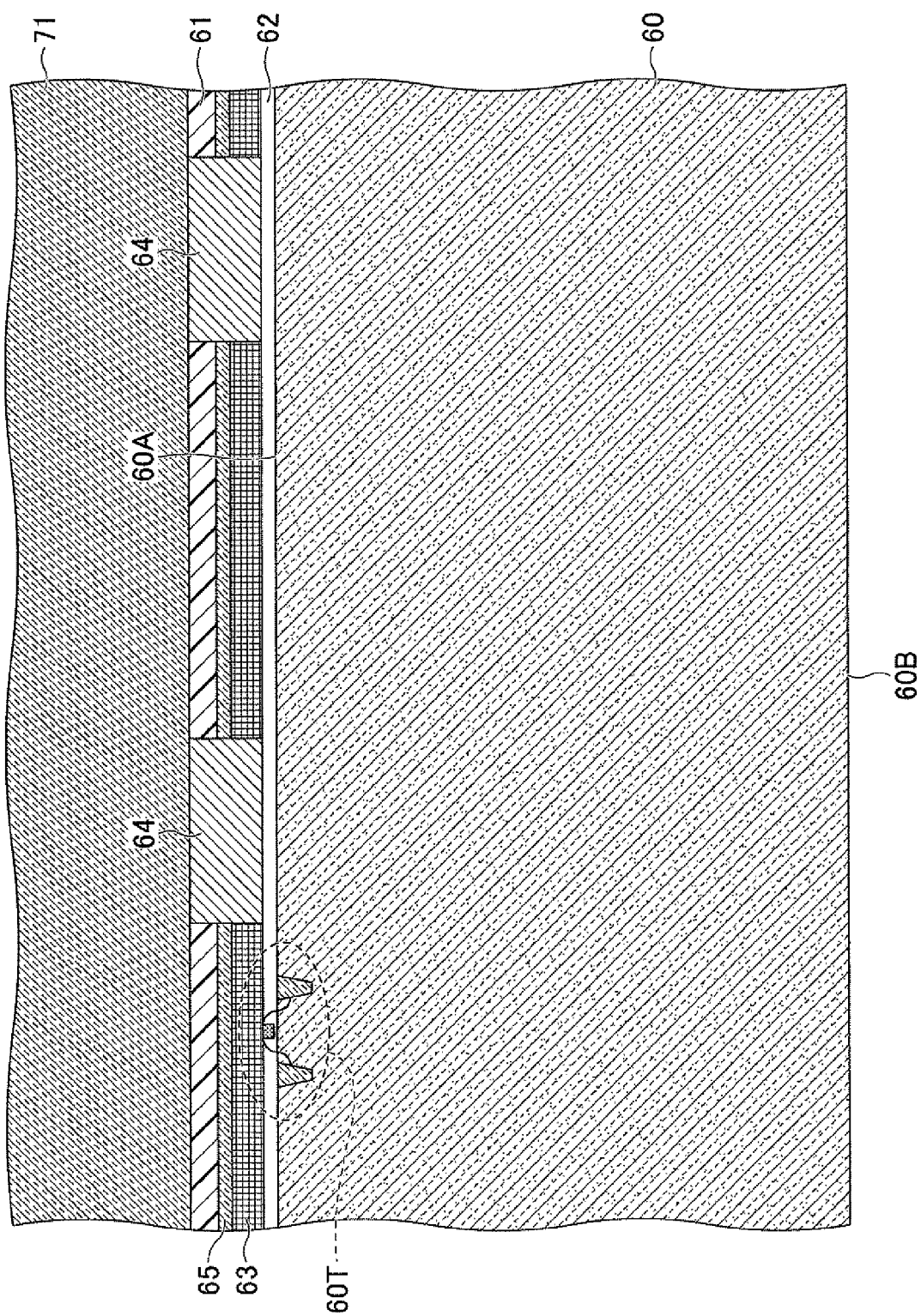
FIG. 10 is an enlarged cross-sectional diagram corresponding to FIG. 9C.

FIG. 10 is a diagram representing a part of the silicon wafer 60 in the state of FIG. 9C.

Referring to FIG. 10, there are formed semiconductor devices 60T such as MOS transistors on the top principal surface 60A of the silicon wafer 60 similarly to the semiconductor device 40T, and a multilayer interconnection structure is formed over the semiconductor device 40T via an insulation film 62 corresponding to the insulation film 42 and formed of silicon oxide film, or the like.

Because the multilayer interconnection structure 63 is formed with connection pads 64 of copper, or the like, at various locations, and further because of the existence of other structural parts, the temporary adhesive layer 61 changes the film thickness thereof locally in the range of 1 μm to 100 μm similarly to the previous embodiment, and thus, there occurs no such a situation that the entirety of the temporary adhesive layer formed by the spin coating process is pushed out or flowed out even when the support substrate 71 is bonded. Thus, the amount of the adhesive pushed out or flowed out should be less than 1% of volume of the applied temporary adhesive layer 61 similarly to the previous embodiment. Thus, it is sufficient to capture the adhesive pushed out or flowed out from the uncured temporary adhesive layer 61 in the step of FIG. 3E or 4A by the groove 60G without causing overflow, by setting the depth to the range of 0.6 mm to 0.25 mm in correspondence to the desired thickness of the silicon substrate and by setting the width to the range of 0.3 mm to 1 mm similarly to the groove 40G of the previous embodiment.

Figure 9D:
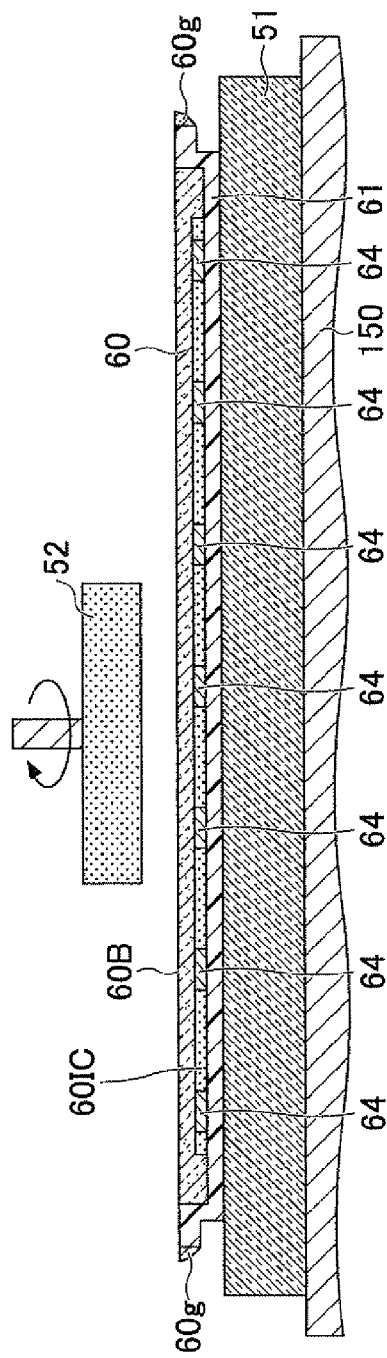

Further, after curing the temporary adhesive layer 61, the silicon wafer 60 of FIG. 9C is turned over as represented in FIG. 9D together with the support substrate 71 bonded thereto, and the bottom principal source 60B is grinded by the grinding wheel 52 while holding the support substrate 71 upon a platen (not illustrated) of the grinding machine. Further, by conducting an etchback process by dry etching, the thickness of the silicon wafer 60 is reduced to the thickness of the silicon substrate in the desired semiconductor chip.

Further, after separating the silicon wafer 60 thus obtained from the support substrate as represented in FIG. 9E, dicing is conducted along predetermined dicing lines, and a large number of semiconductor chips 14 are obtained as represented in FIG. 9F.

Thus, the technology of forming the groove 60G to the outer peripheral part 60R of the silicon wafer 60 and capture the adhesive pushed out or flowed out at the time of bonding the support substrate 71 such that the adhesive does not reach a backside 60B by flowing over the outer peripheral part 60R, is applicable not only to the wafers formed with the through via-plugs but also to the wafers where no such through via-plugs are formed.

In the present embodiment, it is possible to carry out the process of forming the semiconductor integrated circuit device 60IC not in the step of FIG. 9A but in the step of FIG. 9E and hence after the thickness of the silicon wafer 60 is reduced. In this case, the top principal surface 60A of the silicon wafer is flat and there is a possibility that most of the temporary adhesive layer 61 flows into the groove 60G when the support substrate 71 is bonded in the step of FIG. 9C. However, even in such a case, it is possible to suppress the problem of the uncured adhesive cause overflowing from the groove 60G and reach the bottom principal surface 60B by flowing over the edge 60g, by securing sufficient volume for the groove 60G as explained in the previous embodiment.

By forming the semiconductor integrated circuit 60IC on such a thin silicon wafer 60, it is possible to form the through via-plugs after the formation of the semiconductor integrated circuit device 60IC as will be explained in the next embodiment.

[Third Embodiment]

Next, a third embodiment will be explained with reference to FIGS. 11A-11E. In the drawings, those parts explained before are designated by the same reference numerals and the description thereof will be omitted.

The third embodiment is a modification of the second embodiment and reduces the thickness of the silicon wafer 60 to the desired thickness of the silicon substrate of the semiconductor chips by grinding the backside of the silicon wafer 60 not formed with the copper via-plugs as represented in FIG. 11A with the grinding wheel 72 and further applying a dry etching process similarly to the step of FIG. 9D.

Next, the silicon wafer 60 of the reduced thickness is separated from the support substrate 71 by removing the temporary adhesive layer 61 as represented in FIG. 11B. Thereby, the outer wall part 60g remained in ring shaped form is also removed at the same time.

Figure 11C:
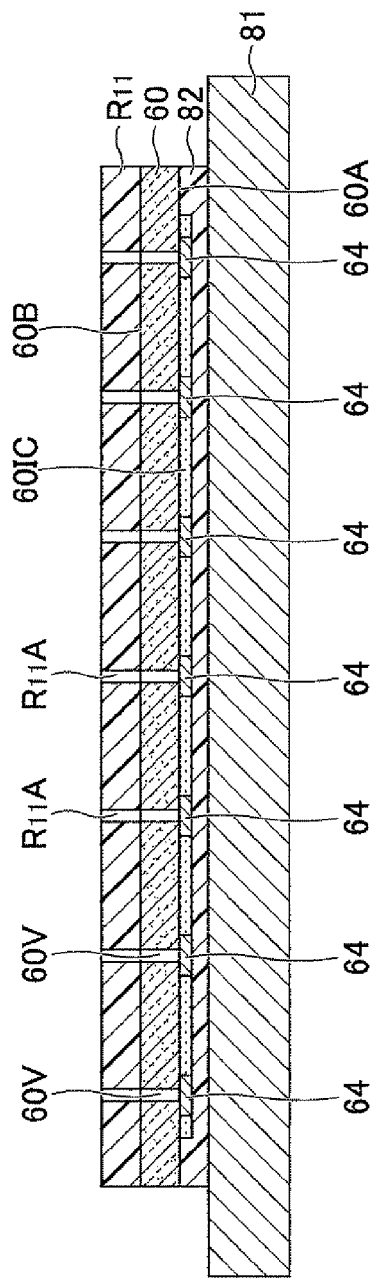
Figure 11D:
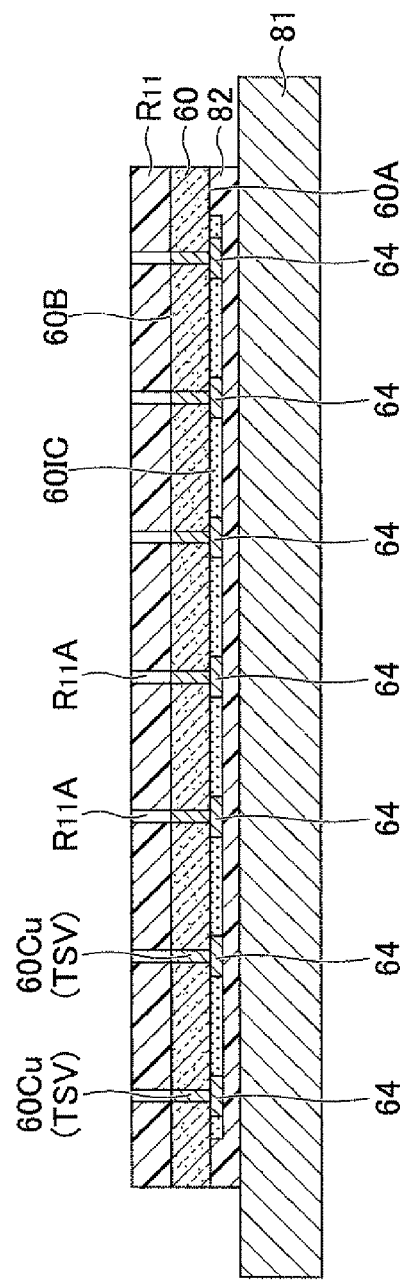
Figure 11E:
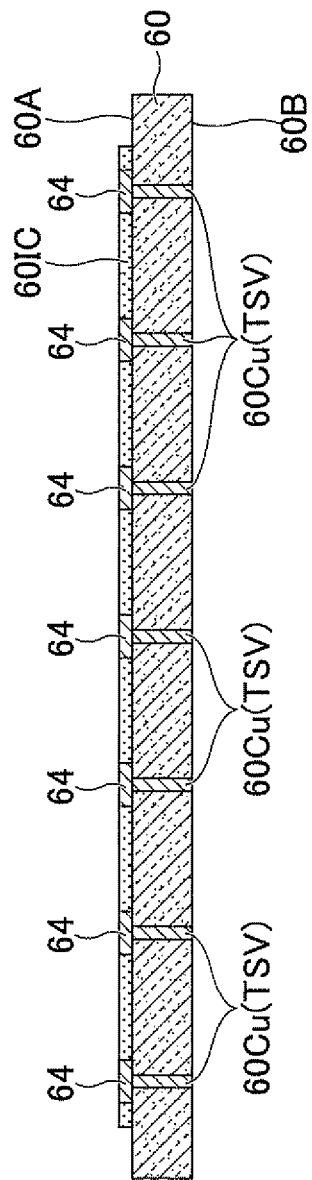

Next, as represented in FIG. 11C, the silicon wafer 60 thus obtained is bonded upon a new support substrate 81 by a new temporary adhesive layer 82 and the silicon wafer 60 is subjected to a dry etching process while using a resist pattern R11 formed on the principal surface 60B of the silicon wafer 60. With this, there are formed through via-holes 60V extending from the bottom principal surface 60B and reaching the top principal surface 60A are formed in correspondence to the connection pads 64 in the multilayer interconnection structure 60IC. It should be noted that the dry etching for forming the through via-holes 60V can be stopped when there is formed a film functioning as an etching stopper to the semiconductor integrated circuit device 60IC in correspondence to the connection pads 64. It will be noted that the resist pattern R11 is formed with resist openings $R_{11}A$ in correspondence to the through via-holes 60V.

Further, by conducting an electrolytic plating process of copper while using the same resist pattern R11 as a mask, the through via-holes 60V are filled with copper and there are formed through via-plugs 60Cu (TSV) of copper.

The silicon wafer 60 thus obtained is separated from the support substrate 81 by removing the temporary adhesive layer 82. Further, by conducing dicing along the scribe lines, the semiconductor chips 12 or 13 of FIG. 1 or 2 are obtained.

Further, according to the present embodiment, it is also possible to use the same silicon wafer 60 and form the semiconductor devices corresponding to the semiconductor chip in the area where the through via-plugs 60Cu (TSV) are not formed and the semiconductor devices corresponding to the semiconductor chips 12 or 13 in the area where the through via-plugs 60Cu (TSV) are formed.

According to the present disclosures, a high exchange coupling energy of the recording layers can be retained even if the exchange-coupling-energy control layer is made thick, whereby it is possible to improve both characteristics and mass production of perpendicular magnetic recording media.

Thus, the present disclosures have been described herein with reference to preferred embodiments. While the present disclosures have been shown and described with particular examples, it should be understood that various changes and modifications may be made to the particular examples without departing from the scope of the broad spirit and scope of the present disclosures as defined in the claims.

All examples and conditional language used herein are intended for pedagogical purposes to aid the reader in understanding the principles of the disclosures and the concepts contributed by the inventor to furthering the art, and are to be construed as being without limitation to such specifically recited examples and conditions, nor does the organization of such examples in the specification relate to a showing of the superiority or inferiority of the disclosures. Although the embodiment of the present disclosures has been described in detail, it should be understood that various changes, substitutions, and alterations could be made hereto without departing from the spirit and scope of the disclosures.

What is claimed is:

1. A method of manufacturing a semiconductor device, comprising:
    forming a groove on a first surface of a semiconductor wafer along an outer periphery of said semiconductor wafer;
    forming a semiconductor device on said first surface;
    forming an adhesive layer on said first surface in direct contact with said first surface to cover said semiconductor device;
    bonding a support substrate on said first surface by said adhesive layer after forming said adhesive layer on said first surface;
    grinding, after said bonding said support substrate, a second surface of said semiconductor wafer opposite to said first surface; and
    dicing, after said grinding, said semiconductor wafer into individual semiconductor chips.

2. The method as claimed in claim 1, wherein forming of said semiconductor device includes forming a metal via-plug in said semiconductor wafer at said first surface to reach said second surface, said metal via-plug forming a through via-plug by grinding of said semiconductor wafer.

3. The method as claimed in claim 1 further comprising, after gridding of said semiconductor wafer, a through via-plug in said semiconductor wafer to penetrate from said first surface to said second surface.

4. The method as claimed claim 1, wherein said groove has an outer end defined by an outer peripheral part constituting an edge of said semiconductor wafer and has a volume exceeding a volume of an adhesive expelled from said adhesive layer at the time of bonding of said support substrate.

5. The method as claimed in claim 4, wherein a height of said outer peripheral part as measured from said second surface is lower than a height of said first surface.

6. The method as claimed in claim 1, wherein said groove is defined by a bottom surface and mutually opposing sidewalls and has a rectangular cross-section in a radial direction of said semiconductor wafer.

7. The method as claimed in claim 6, wherein said groove is divided into a plurality of parts by one or more projections formed on said bottom surface of said groove with a height as measured from said second surface lower than said first surface.

8. The method as claimed in claim 6, wherein said groove has a depth in the range of 0.6 mm to 0.25 mm and a width in the range of 0.3 mm to 1 mm.

9. The method as claimed in claim 1, wherein said groove has a triangular cross-section defined by a first sloped surface increasing a depth with regard to said first surface toward a radially inward direction of said semiconductor wafer from a top end of said outer peripheral part and a second sloped surface continuing to said first sloped surface and decreasing a depth with regard to said first surface toward said radially inward direction of said semiconductor wafer.

10. The method as claimed in claim 1, wherein said groove includes a plurality of triangular depressions repeated in a radial direction of said semiconductor wafer in a sawtooth form, said triangular depression being defined by a first sloped surface increasing a depth with regard to said first surface toward a radially inward direction of said semiconductor wafer and a second sloped surface continuing to said first sloped surface and decreasing a depth with regard to said first surface toward said radially inward direction of said semiconductor wafer.

11. A method of processing a semiconductor wafer, comprising:
    forming a groove on a first surface of a semiconductor wafer along an outer periphery of said semiconductor wafer;
    forming a semiconductor device on said first surface;
    forming an adhesive layer on said first surface in direct contact with said first surface to cover said semiconductor device;
    bonding a support substrate on said first surface by said adhesive layer after forming said adhesive layer on said first surface; and
    grinding, after said adhering of said support substrate, a second surface of said semiconductor wafer opposite to said first surface.

* * * * *